United States Patent
Ouellet et al.

(10) Patent No.: US 6,537,623 B2
(45) Date of Patent: Mar. 25, 2003

(54) MANUFACTURE OF SILICA WAVEGUIDES WITH MINIMAL ABSORPTION

(75) Inventors: Luc Ouellet, Granby (CA); Manuel Grondin, Granby (CA)

(73) Assignee: Dalsa Semiconductor Inc., Waterloo (CA)

( * ) Notice: Subject to any disclaimer, the term of this patent is extended or adjusted under 35 U.S.C. 154(b) by 29 days.

(21) Appl. No.: 09/799,496

(22) Filed: Mar. 7, 2001

(65) Prior Publication Data

US 2002/0071914 A1 Jun. 13, 2002

(30) Foreign Application Priority Data

Dec. 12, 2000 (GB) .............................................. 0030236

(51) Int. Cl.[7] .......................... C23C 16/40; C23C 16/50; C23C 16/56; G02B 6/10; B05D 3/02

(52) U.S. Cl. ..................... 427/579; 427/163.2; 427/167; 427/255.37; 427/379; 427/397.7; 385/129; 385/130

(58) Field of Search .................................. 427/569, 579, 427/255.18, 255.23, 255.37, 372.2, 374.1, 377, 444, 162, 163.2, 374.2, 374.3, 374.6, 379, 578, 167, 255.28, 397.7; 385/129, 130

(56) References Cited

U.S. PATENT DOCUMENTS

| | | | | |
|---|---|---|---|---|
| 3,887,733 A | * | 6/1975 | Tolliver et al. | 148/DIG. 133 |
| 4,585,492 A | * | 4/1986 | Weinberg et al. | 148/DIG. 4 |
| 4,784,975 A | * | 11/1988 | Hofmann et al. | 148/DIG. 4 |
| 5,610,105 A | | 3/1997 | Vines et al. | 437/235 |
| 5,614,270 A | | 3/1997 | Yeh et al. | 427/539 |
| 5,699,035 A | * | 12/1997 | Ito et al. | 338/20 |
| 5,861,197 A | * | 1/1999 | Law et al. | 427/109 |
| 5,904,491 A | * | 5/1999 | Ojha et al. | 385/131 |
| 5,966,627 A | * | 10/1999 | Brady et al. | 438/297 |
| 5,979,188 A | * | 11/1999 | Ojha | 427/163.2 |
| 6,121,061 A | * | 9/2000 | Van Bilsen et al. | 118/725 |
| 6,235,563 B1 | * | 5/2001 | Oka et al. | 438/166 |

FOREIGN PATENT DOCUMENTS

| | | | | |
|---|---|---|---|---|
| EP | 0 170 848 A2 | 12/1986 | ......... | H01L/21/268 |
| EP | 0 337 725 A2 | 10/1989 | ........... | H01L/39/24 |
| EP | 0 471 845 A1 | 2/1992 | ......... | H01L/21/316 |

OTHER PUBLICATIONS

"Arrayed–waveguide grating wavelength multiplexers for WDM systems", Hiroshi Takashi et al., vol. 10, No. 1., Jan. 1998, pp. 37–44.

"PLC hybrid integrated WDM transceiver module for access netoworks", Yasuyuki Inoue et al., vol. 9, No. 6, Nov. 1997, pp. 55–64.

"Silica–based planar lightwave circuits for WDM systems", Yasuyuki Inoue et al., vol.E80–C. No. 5, May 1997, pp. 609–618.

"Passively aligned hybrid WDM module integrated with spot–size converter integrated laser diode and waveguide photodiode on PLC platform for fibre–to–the–home", N. Uchida et al., vol. 32, No. 18, Aug. 1996, pp. 1664–1665.

"Silica glass waveguide structure and its application to a multi/demultiplexer", Katsuyuki Imoto et al., pp. 577–580.

(List continued on next page.)

Primary Examiner—Timothy Meeks
Assistant Examiner—Wesley Markham
(74) Attorney, Agent, or Firm—Marks & Clerk

(57) ABSTRACT

An improved high temperature chemical treatment of deposited silica films wherein they are subjected to a reactive ambient comprising hydrogen and oxygen atoms. This method results in better elimination of residual undesirable oscillators so as to provide improved optical quality silica waveguides with reduced optical absorption.

23 Claims, 16 Drawing Sheets

OTHER PUBLICATIONS

"Plasma–enhanced chemical vapor deposition of low–loss SiON optical waveguides at 1.5–um wavelength", Franco Bruno et al., Applied Optics, vol. 30, No. 31, Nov. 1991, pp. 4560–4564.

"High refractive index difference and low loss optical waveguide fabricated by low temperature processes", K. Imoto et Electronics Letters, vol. 29, No. 12, Jun. 10, 1993, pp. 1123–1124.

"Simple technologies for fabrication of low–loss silica waveguides", Q. Lai et al.

"Formation of optical slab waveguides using thermal oxidation of SiOx", Q. Lai et al., Electronics Letters, vol. 29, No. 8, Apr. 15, 1993, pp. 714–716.

"Single–mode SiON/SiO2/Si optical waveguides prepared by plasma–enhanced chemical vapor deposition", Y.–K. Tu et al., Fiber and Integrated Optics, vol. 14, pp. 133–139.

"High quality low temperature DPECVD silicon dioxide" I. Pereyra et al., Journal of Non–Crystalline Solids, 212, (1997) 225–231.

"Thick SiOx/Ny and SiO2 films obtained by PECVD technique at low temperatures", M.I. Alayo et al., Thin Solid Film 332 (1998) pp. 40–45.

"Silicon–oxynitride layers for optical waveguide applications", R. Germann et al., Abstract No. 137.

"Plasma enhanced chemical vapor deposition silicon oxynitride optimized for application in integrated optics", K. Worhoff et al., Sensors and Actuators, 74, (1999), pp. 9–12.

"A luminescence study of silicon–rich silica and rare–earth doped silicon–rich silica", A.J. Kenyon et al., Electrochemical Society Proceedings, vol. 97–11, pp. 304–318.

"Low temperature, nitrogen doped waveguides on silicon with small core dimensions fabricated by PECVD/RIE", M. Hoffman et al. Waveguide Technology, pp. 299–301.

"Low–loss fiber–matched low–temperature PECVD waveguides with small–core dimensions for optical communication systems", Martin Hoffmann et al., IEEE Photonics Technology Letters, vol. 9, No. 9, Sep. 1997, pp. 1238–1240.

"Rapid deposition of high–quality silicon–oxinitride waveguides", K. Kapser et al., IEEE Transactions Photonics Technology Letters, vol. 3, No. 12, Dec. 1991, pp. 1096–1098.

"Pure and fluorine–doped silica films deposited in a hollow cathode reactor for integrated optic applications", M.V. Bazylenko et al., J. Vac. Sci. Technol. A 14(2), (1996), pp. 336–345.

"Low–loss PECVD silica channel waveguides for optical communications", Electronics Letters, vol. 26, No. 2 Dec. 6, 1990, pates 2135–2137.

"Integrated four–channel mach–zehnder multi–demultiplexer fabricated with phosphorous doped SiO2 waveguides on Si", B.H. Verbeek et al., Journal of Lightwave Technology, vol. 6, No. 6, Jun. 1988, pp. 1011–1015.

"Thermal annealing of waveguides formed by ion implantation of silica–on–Si", C.M. Johnson et al., Nuclear Instruments and Methods in Physics Research B, 141 (1998) pp. 670–674.

"Realization of SiO2–B2O3–TIO2 waveguides and reflectors on Si substrates", Hartmut W. Schneider, Mat. Res. Soc. Symp. Proc. vol. 244, (1992), pp. 337–342.

"Recent progress in silica–based planar lightwave circuits on silicon", M. Kawachi, IEEE Proc. Optoelectron, vol. 143, Oct. 1996, pp. 257–262.

"Silica–based planar lightwave circuits", Akira Himeno et al., IEEE Journal of Selected Topics in Quantum Electronics vol. 4, No. 6, (1998) pp. 913–924.

"Glass waveguides on silicon for hybrid optical packaging", C.H. Henry et al., Journal of Lightwave Technology, vol. No. 10, Oct. 1989, pp. 1530–1539.

"Silicon oxynitride planar waveguiding structures for application in optical communication", Rene M. de Ridder et al. IEEE Journal of Selected Topics in Quantum Electronics, vol. 4, No. 6, 1998, pp. 930–936.

"Formation of Optical Slab Waveguides Using Thermal Oxidation of SiO", Q. Lai et al., Electronics Letters, Apr. 15, 1993, vol. 29, No. 8, pp. 714–716.

"Arbitrary Ratio Power Splitters Using Angled Silica on Silicon Multi–Mode Interference Couplers", Q. Lai et al., 22nd European Conference on Optical Communication, ECOC '96 Oslo, pp. 129.

"Low–PowerCompact 2×2 Thermooptic Silica–on–Silicon Waveguide Switch with Fast Response", Q. Lai et al., IEEE Photonics Technology Letters, vol. 10, No. 5, May 1998, p. 681–683.

\* cited by examiner

| | Compound | PECVD chemical reaction |
|---|---|---|
| Si compounds | SiH4(g) | SiH4(g)+2N2O(g)=SiH4(g)+2N2O(g) |
| | SiNH | SiH4(g)+2N2O(g)=SiNH+NH3(g)+N2(g)+O2(g) |
| | SiNH3 | SiH4(g)+2N2O(g)=SiNH3+N2O(g)+HNO(g) |
| | SiN2 | SiH4+2N2O(g)=SiN2+2H2O(g)+N2(g) |
| | SiN2H2 | SiH4(g)+2N2O(g)=SiN2H2+N2O(g)+H2O(g) |
| | SiN2H4 | SiH4(g)+2N2O(g)=SiN2H4+N2(g)+O2(g) |
| | SiN3H | SiH4(g)+2N2O(g)=SiN3H+NH3(g)+O2(g) |
| | SiN3H3 | SiH4(g)+3N2O(g)=SiN3H3+HNO(g)+O2(g)+N2(g) |
| | SiN4 | SiH4(g)+2N2O(g)=SiN4+2H2O(g) |
| | SiN4H2 | SiH4(g)+2N2O(g)=SiN4H2+O2(g)+H2(g) |
| | SiN4H4 | SiH4(g)+2N2O(g)=SiN4H4+O2(g) |
| SiO compounds | SiOH2 | SiH4(g)+2N2O(g)=SiOH2+H2O(g)+2N2(g) |
| | SiOH4 | SiH4(g)+2N2O(g)=SiOH4+N2O(g)+N2(g) |
| | SiONH | SiH4(g)+2N2O(g)=SiONH+N2O(g)+NH3(g) |
| | SiONH3 | SiH4(g)+2N2O(g)=SiONH3+HNO(g)+N2(g) |
| | SiON2 | SiH4(g)+2N2O(g)=SiON2+H2O(g)+N2(g)+H2(g) |
| | SiON2H2 | SiH4(g)+2N2O(g)=SiON2H2+N2O(g)+H2(g) |
| | SiON2H4 | SiH4(g)+2N2O(g)=SiON2H4+N2O(g) |
| | SiON3H | SiH4(g)+2N2O(g)=SiON3H+HNO(g)+H2(g) |
| | SiON3H3 | SiH4(g)+2N2O(g)=SiON3H3+HNO(g) |
| | SiON4 | SiH4(g)+2N2O(g)=SiON4+H2O(g)+H2(g) |
| | SiON4H2 | SiH4(g)+2N2O(g)=SiON4H2+H2O(g) |
| | SiON4H4 | SiH4(g)+3N2O(g)=SiON4H4+N2(g)+O2(g) |
| SiO2 compounds | SiO2 | SiH4(g)+2N2O(g)=SiO2=2HO(g)+2N2(g) |
| | SiO2H2 | SiH4(g)+2N2O(g)=SiO2H2+2N2(g)+H2(g) |
| | SiO2H4 | SiH4(g)+2N2O(g)=SiO2H4+2N2(g) |
| | SiO2NH | SiH4(g)+2N2O(g)=SiO2NH+NH3(g)+N2(g) |
| | SiO2NH3 | SiH4(g)+2N2O(g)=SiO2NH3+N3H(g) |
| | SiO2N2 | SiH4(g)+2N2O(g)=SiO2N2+N2(g)+2H2(g) |
| | SiO2N2H2 | SiH4(g)+2N2O(g)=SiO2N2H2+N2(g)+H2(g) |
| | SiO2N2H4 | SiH4(g)+2N2O(g)=SiO2N2H4+N2(g) |
| | SiO2N3H | SiH4(g)+2N2O(g)=SiO2N3H+NH3(g) |
| | SiO2N4 | SiH4(g)+2N2O(g)=SiO2N4+2H2(g) |
| | SiO2N4H2 | SiH4(g)+2N2O(g)=SiO2N4H2+H2(g) |
| | SiO2N4H4 | SiH4(g)+2N2O(g)=SiO2N4H4 |

FIG. 1

| | Compound | High T° thermal treatment reaction | New compound |
|---|---|---|---|
| Si compounds | SiH4(g) | SiH4+N2(g)=SiNH+NH3(g) | SiNH |
| | SiNH | SiNH+N2(g)=SiNH+N2(g) | SiNH |
| | SiNH3 | SiNH3+N2(g)=SiNH+N2(g)+H2(g) | SiNH |
| | SiN2 | SiN2+N2(g)=SiN2+N2(g) | SiN2 |
| | SiN2H2 | SiN2H2+N2(g)=SiN2+N2(g)+H2(g) | SiN2 |
| | SiN2H4 | SiN2H4+N2(g)=SiN2+N2(g)+2H2(g) | SiN2 |
| | SiN3H | SiN3H+N2(g)=SiNH+2N2(g) | SiNH |
| | SiN3H3 | SiN3H3+N2(g)=SiNH+2N2(g)+H2(g) | SiNH |
| | SiN4 | SiN4+N2(g)=SiN2+2N2(g) | SiN2 |
| | SiN4H2 | SiN4H2+N2(g)=SiN2+2N2(g)+H2(g) | SiN2 |
| | SiN4H4 | SiN4H4+N2(g)=SiN2+2N2(g)+2H2(g) | SiN2 |
| SiO compounds | SiOH2 | SiOH2+N2(g)=SiOH2+N2(g) | SiOH2 |
| | SiOH4 | SiOH4+N2(g)=SiOH2+N2(g)+H2(g) | SiOH2 |
| | SiONH | SiONH+N2(g)=SiONH+N2(g) | SiONH |
| | SiONH3 | SiONH3+N2(g)=SiONH+N2(g)+H2(g) | SiONH |
| | SiON2 | SiON2+N2(g)=SiON2+N2(g) | SiON2 |
| | SiON2H2 | SiON2H2+N2(g)=SiON2+N2(g)+H2(g) | SiON2 |
| | SiON2H4 | SiON2H4+N2(g)=SiON2+N2(g)+2H2(g) | SiON2 |
| | SiON3H | SiON3H+N2(g)=SiONH+2N2(g) | SiONH |
| | SiON3H3 | SiON3H3+N2(g)=SiONH+2N2(g)+H2(g) | SiONH |
| | SiON4 | SiON4+N2(g)=SiON2+2N2(g) | SiON2 |
| | SiON4H2 | SiON4H2+N2(g)=SiON2+2N2(g)+H2(g) | SiON2 |
| | SiON4H4 | SiON4H4+N2(g)=SiON2+2N2(g)+2H2(g) | SiON2 |
| SiO2 compounds | SiO2 | SiO2+N2(g)=SiO2+N2(g) | SiO2 |
| | SiO2H2 | SiO2H2+N2(g)=SiO2+N2(g)+H2(g) | SiO2 |
| | SiO2H4 | SiO2H4+N2(g)=SiO2+N2(g)+2H2(g) | SiO2 |
| | SiO2NH | SiO2NH+N2(g)=SiO2NH+N2(g) | SiO2 |
| | SiO2NH3 | SiO2NH3+N2(g)=SiO2+NH3(g)+N2(g) | SiO2 |
| | SiO2N2 | SiO2N2+N2(g)=SiO2+2N2(g) | SiO2 |
| | SiO2N2H2 | SiO2N2H2+N2(g)=SiO2+2N2(g)+H2(g) | SiO2 |
| | SiO2N2H4 | SiO2N2H4+N2(g)=SiO2+2N2(g)+2H2(g) | SiO2 |
| | SiO2N3H | SiO2N3H+N2(g)=SiO2NH+2N2(g) | SiO2 |
| | SiO2N4 | SiO2N4+N2(g)=SiO2+3N2(g) | SiO2 |
| | SiO2N4H2 | SiO2N4H2+N2(g)=SiO2+3N2(g)+H2(g) | SiO2 |
| | SiO2N4H4 | SiO2N4H4+N2(g)=SiO2+3N2(g)+2H2(g) | SiO2 |

FIG. 2

| | | HO-H | SiO-H | SiN-H | Si:N-H | Si-H | Si=O | N=N | Si-O-Si | Si-O-Si | Si-ON | Si-OH | Si-O-Si | Si-O-Si |
|---|---|---|---|---|---|---|---|---|---|---|---|---|---|---|
| FTIR 1st. mode (cm-1) | Min. | 3550 | 3470 | 3380 | 3300 | 2210 | 1800 | 1530 | 1080 | 1000 | 910 | 860 | 740 | 410 |
| | Ave | 3650 | 3510 | 3420 | 3380 | 2260 | 1875 | 1555 | 1180 | 1080 | 950 | 885 | 810 | 460 |
| | Max. | 3750 | 3550 | 3460 | 3460 | 2310 | 1950 | 1580 | 1280 | 1160 | 990 | 910 | 880 | 510 |
| 1st. mode (mm) | Min. | 2.817 | 2.882 | 2.959 | 3.030 | 4.525 | 5.556 | 6.536 | 9.259 | 10.000 | 10.989 | 11.628 | 13.514 | 24.390 |
| | Ave | 2.740 | 2.849 | 2.924 | 2.959 | 4.425 | 5.333 | 6.431 | 8.475 | 9.259 | 10.526 | 11.299 | 12.346 | 21.739 |
| | Max. | 2.667 | 2.817 | 2.890 | 2.890 | 4.329 | 5.128 | 6.329 | 7.813 | 8.621 | 10.101 | 10.989 | 11.364 | 19.608 |
| 2nd. mode (mm) | Min. | 1.408 | 1.441 | 1.479 | 1.515 | 2.262 | 2.778 | 3.268 | 4.630 | 5.000 | 5.495 | 5.814 | 6.757 | 12.195 |
| | Ave | 1.370 | 1.425 | 1.462 | 1.479 | 2.212 | 2.667 | 3.215 | 4.237 | 4.630 | 5.263 | 5.650 | 6.173 | 10.870 |
| | Max. | 1.333 | 1.408 | 1.445 | 1.445 | 2.165 | 2.564 | 3.165 | 3.906 | 4.310 | 5.051 | 5.495 | 5.682 | 9.804 |
| 3rd. mode (mm) | Min. | 0.939 | 0.961 | 0.986 | 1.010 | 1.508 | 1.852 | 2.179 | 3.086 | 3.333 | 3.663 | 3.876 | 4.505 | 8.130 |
| | Ave | 0.913 | 0.950 | 0.975 | 0.986 | 1.475 | 1.778 | 2.144 | 2.825 | 3.086 | 3.509 | 3.766 | 4.115 | 7.246 |
| | Max. | 0.889 | 0.939 | 0.963 | 0.963 | 1.443 | 1.709 | 2.110 | 2.604 | 2.874 | 3.367 | 3.663 | 3.788 | 6.536 |
| 4th. mode (mm) | Min. | 0.704 | 0.720 | 0.740 | 0.758 | 1.131 | 1.389 | 1.634 | 2.315 | 2.500 | 2.747 | 2.907 | 3.378 | 6.098 |
| | Ave | 0.685 | 0.712 | 0.731 | 0.740 | 1.106 | 1.333 | 1.608 | 2.119 | 2.315 | 2.632 | 2.825 | 3.086 | 5.435 |
| | Max. | 0.667 | 0.704 | 0.723 | 0.723 | 1.082 | 1.282 | 1.582 | 1.953 | 2.155 | 2.525 | 2.747 | 2.841 | 4.902 |
| 5th mode (mm) | Min. | 0.563 | 0.576 | 0.592 | 0.606 | 0.905 | 1.111 | 1.307 | 1.852 | 2.000 | 2.198 | 2.326 | 2.703 | 4.878 |
| | Ave | 0.548 | 0.570 | 0.585 | 0.592 | 0.885 | 1.067 | 1.286 | 1.695 | 1.852 | 2.105 | 2.260 | 2.469 | 4.348 |
| | Max. | 0.533 | 0.563 | 0.578 | 0.578 | 0.866 | 1.026 | 1.266 | 1.563 | 1.724 | 2.020 | 2.198 | 2.273 | 3.922 |
| 6th. mode (mm) | Min. | 0.469 | 0.480 | 0.493 | 0.505 | 0.754 | 0.926 | 1.089 | 1.543 | 1.667 | 1.832 | 1.938 | 2.252 | 4.065 |
| | Ave | 0.457 | 0.475 | 0.487 | 0.493 | 0.737 | 0.889 | 1.072 | 1.412 | 1.543 | 1.754 | 1.883 | 2.058 | 3.623 |
| | Max. | 0.444 | 0.469 | 0.482 | 0.482 | 0.722 | 0.855 | 1.055 | 1.302 | 1.437 | 1.684 | 1.832 | 1.894 | 3.268 |
| 7th. mode (mm) | Min. | 0.402 | 0.412 | 0.423 | 0.433 | 0.646 | 0.794 | 0.934 | 1.323 | 1.429 | 1.570 | 1.661 | 1.931 | 3.484 |
| | Ave | 0.391 | 0.407 | 0.418 | 0.423 | 0.632 | 0.762 | 0.919 | 1.211 | 1.323 | 1.504 | 1.614 | 1.764 | 3.106 |
| | Max. | 0.381 | 0.402 | 0.413 | 0.413 | 0.618 | 0.733 | 0.904 | 1.116 | 1.232 | 1.443 | 1.570 | 1.623 | 2.801 |
| 8th. mode (mm) | Min. | 0.352 | 0.360 | 0.370 | 0.379 | 0.566 | 0.694 | 0.817 | 1.157 | 1.250 | 1.374 | 1.453 | 1.689 | 3.049 |
| | Ave | 0.342 | 0.356 | 0.365 | 0.370 | 0.553 | 0.667 | 0.804 | 1.059 | 1.157 | 1.316 | 1.412 | 1.543 | 2.717 |
| | Max. | 0.333 | 0.352 | 0.361 | 0.361 | 0.541 | 0.641 | 0.791 | 0.977 | 1.078 | 1.263 | 1.374 | 1.420 | 2.451 |

FIG. 3

| | Compound | High T° chemical treatment reaction | New compound |
|---|---|---|---|
| Si Compounds | SiH4(g) | SiH4+O2(g)=SiO2+2H2(g) | SiO2 |
| | SiNH | SiNH+2H2O(g)=SiO2+NH3(g)+H2(g) | SiO2 |
| | SiNH3 | SiNH3+O2(g)=SiO2+NH3(g) | SiO2 |
| | SiN2 | SiN2+O2(g)=SiO2+N2(g) | SiO2 |
| | SiN2H2 | SiN2H2+O2(g)=SiO2+N2(g)+H2(g) | SiO2 |
| | SiN2H4 | SiN2H4+O2(g)=SiO2+N2(g)+2H2(g) | SiO2 |
| | SiN3H | SiN3H+O2(g)+H2(g)=SiO2+NH3(g)+N2(g) | SiO2 |
| | SiN3H3 | SiN3H3+O2(g)=SiO2+NH3(g)+N2(g) | SiO2 |
| | SiN4 | SiN4+O2(g)=SiO2+2N2(g) | SiO2 |
| | SiN4H2 | SiN4H2+O2=SiO2+2N2(g)+H2(g) | SiO2 |
| | SiN4H4 | SiN4H4+O2(g)=SiO2+2N2(g)+2H2(g) | SiO2 |
| SiO Compounds | SiOH2 | SiOH2+H2O(g)=SiO2+2H2(g) | SiO2 |
| | SiOH4 | SiOH4+H2O(g)=SiO2+3H2(g) | SiO2 |
| | SiONH | SiONH+H2O(g)=SiO2+NH3(g) | SiO2 |
| | SiONH3 | SiONH3+H2O(g)=SiO2+NH3(g)+H2(g) | SiO2 |
| | SiON2 | SiON2+H2O(g)=SiO2+N2(g)+H2(g) | SiO2 |
| | SiON2H2 | SiON2H2+H2O(g)=SiO2+N2(g)+2H2(g) | SiO2 |
| | SiON2H4 | SiON2H4+H2O(g)=SiO2+N2(g)+3H2(g) | SiO2 |
| | SiON3H | SiON3H+H2O(g)=SiO2+NH3(g)+N2(g) | SiO2 |
| | SiON3H3 | SiON3H3+H2O(g)=SiO2+NH3(g)+N2(g)+H2(g) | SiO2 |
| | SiON4 | SiON4+H2O(g)=SiO2+2N2(g)+H2(g) | SiO2 |
| | SiON4H2 | SiON4H2+H2O(g)=SiO2+2N2(g)+2H2(g) | SiO2 |
| | SiON4H4 | SiON4H4+H2O(g)=SiO2+2N2(g)+3H2(g) | SiO2 |
| SiO2 Compounds | SiO2H2 | SiO2H2+H2O(g)=SiO2+H2O(g)+H2(g) | SiO2 |
| | SiO2H4 | SiO2H4+H2O(g)=SiO2+H2O(g)+2H2(g) | SiO2 |
| | SiO2NH | SiO2NH+H2(g)=SiO2+NH3(g) | SiO2 |
| | SiO2NH3 | SiO2NH3+H2O(g)=SiO2+NH3(g)+H2O(g) | SiO2 |
| | SiO2N2 | SiO2N2+H2O(g)=SiO2+H2O(g)+N2(g) | SiO2 |
| | SiO2N2H2 | SiO2N2H2+H2O(g)=SiO2+H2O(g)+N2(g)+H2(g) | SiO2 |
| | SiO2N2H4 | SiO2N2H4+H2O(g)=SiO2+H2O(g)+N2(g)+2H2(g) | SiO2 |
| | SiO2N3H | SiO2N3H+H2O(g)=SiO2+HNO(g)+N2(g)+H2(g) | SiO2 |
| | SiO2N4 | SiO2N4+H2O(g)=SiO2+H2O(g)+2N2(g) | SiO2 |
| | SiO2N4H2 | SiO2N4H2+H2O(g)=SiO2+H2O(g)+2N2(g)+H2(g) | SiO2 |
| | SiO2N4H4 | SiO2N4H4+H2O(g)=SiO2+H2O(g)+2N2(g)+2H2(g) | SiO2 |

FIG. 4

MANUFACTURE OF SILICA WAVEGUIDES WITH MINIMAL ABSORPTION

FIELD OF THE INVENTION

This invention relates to an improved method for manufacturing silica waveguides with minimal absorption.

BACKGROUND OF THE INVENTION

The manufacture of optical devices which employ silica waveguides, such as optical Multiplexers (Mux) and Demultiplexers (Dmux), entails depositing silica films onto a silicon wafer. The silica films are ideally of optical quality, characterised in that they are transparent in the 1.30 $\mu$m bi-directional narrow optical band and/or in the 1.55 $\mu$m video signal optical band. Such optical quality silica films are extremely difficult to produce in reality because hydrogen and nitrogen atoms are typically present in the films. These impurities in the silica films result in excessive optical absorption in the 1.30 and 1.55 $\mu$m optical bands.

Fourier Transform Infrared (FTIR) spectroscopy can be used to monitor the quality of optical silica films. The FTIR spectra of optical quality silica films, containing no undesirable optical absorption peaks, are characterised by the presence of only four fundamental optical absorption peaks: (1) an intense and small Full Width at Half Maximum (FWHM) Si—O—Si "rocking mode" absorption peak ranging between 410 and 510 cm$^{-1}$, centred at 460 cm$^{-1}$ (21.739 $\mu$m); (2) a small FWHM Si—O—Si "bending mode" absorption peak ranging between 740 and 880 cm$^{-1}$, centred at 810 cm$^{-1}$ (12.346 $\mu$m); (3) an intense and small Full Width at Half Maximum (FWHM) Si—O—Si "in-phase-stretching mode" absorption peak ranging between 1000 and 1160 cm$^{-1}$, centred at 1080 cm$^{-1}$ (9.256 $\mu$m) indicating stoichiometric silica films with the optimum Si—O—Si bond angle of 144° and the optimum density; and (4) an almost eliminated Si—O—Si "out-of-phase-stretching mode" absorption peak ranging between 1080 and 1280 cm$^{-1}$, centred at 1180 cm$^{-1}$ (8.475 $\mu$m), as compared to the Si—O—Si in-phase-stretching mode absorption peak.

The position in the infrared spectrum of these four fundamental (first mode) infrared absorption peaks, respectively centered at 21.739 $\mu$m, 12.346 $\mu$m, 9.256 $\mu$m, and 8.475 $\mu$m, is far away from the infrared bands of interest at 1.30 and 1.55 $\mu$m. However, residual absorption of optical quality silica is never completely eliminated because the higher harmonics of these four residual optical absorption peaks do cause small residual optical absorption peaks in the 1.30 and 1.55 $\mu$m optical band. The very high harmonics (i.e. very little absorption effect) falling within this range are: the sixth (1.302 to 1.543 $\mu$m) and seventh (1.116 to 1.323 $\mu$m) harmonics of the Si—O—Si "out-of-phase-stretching mode" infrared absorption peak; the sixth (1.437 to 1.667 $\mu$m) and seventh (1.232 to 1.429 $\mu$m) harmonics of the Si—O—Si "in-phase-stretching mode" infrared absorption peak; the eighth (1.420 to 1.689 $\mu$m) and ninth (1.263 to 1.502 $\mu$m) harmonics of the Si—O—Si "bending mode" infrared absorption peak; and the thirteenth (1.508 to 1.876 $\mu$m) and fourteenth (1.401 to 1.742 $\mu$m) and fifteenth (1.307 to 1.626 $\mu$m) harmonics of the Si—O—Si "rocking mode" infrared absorption peak.

The FTIR spectra of optical quality silica films are also characterised by a net separation between the Si—O—Si "in-phase-stretching mode" absorption peak (1080 cm$^{-1}$) and the Si—O—Si "bending mode" absorption peak (810 cm$^{-1}$) with a deep valley between 850 and 1000 cm$^{-1}$.

Silica films may be deposited onto a silicon wafer using a silane (SiH$_4$) and nitrous oxide (N$_2$O) gas mixture at a low temperature according to the following reaction:

$$SiH_4(g) + 2N_2O(g) \rightarrow SiO_2 + 2N_2(g) + 2H_2(g)$$

Theoretically, it is possible to achieve optical quality silica films from this reaction. However, in reality, numerous side reactions occur, forming a mixture of undesirable Si—O$_x$—H$_y$—N$_z$ compounds. For example, FIG. 1 presents the various potential Si—O$_x$—H$_y$—N$_z$ compounds that may result from the combination of silane (SiH$_4$) and nitrous oxide (N$_2$O) gases. It shows 35 products that could be found in silica films deposited from a silane (SiH$_4$) and nitrous oxide (N$_2$O) gas mixture. N$_2$, O$_2$, HNO, NH$_3$, H$_2$O, and H$_2$ gaseous by-products are eliminated from the surface or from the micro-pores of the silica films during these chemical reactions. As a result of the production of these side-products, the incorporation of oxygen atoms, a key factor to achieve optical quality silica, competes with the incorporation of nitrogen and hydrogen atoms in the silica films. Thus, the silica films as deposited on the silicon wafer are not optical quality silica films, due to the absorption by the undesirable Si—O$_x$—H$_y$—N$_z$ compounds formed.

To resolve this problem caused by Si—O$_x$—H$_y$—N$_z$ impurities in the films, techniques have been used wherein the silica films are subject to a high temperature (typically, between 600 and 1350° C.) thermal treatment under vacuum, argon (Ar), or a nitrogen atmosphere as a means for reducing the optical absorption of silica films in the 1.30 and 1.55 $\mu$m optical regions. In general, the higher the temperature of this high temperature thermal treatment, the lower the optical absorption of the silica films. However, unlike fused silica optical fibres, that are heated at a temperature exceeding about 2000° C. during the drawing process, the high temperature thermal treatment of the silica films on silicon wafers is performed at a temperature ranging from 600° C. to a maximum temperature of about 1350° C., close to the fusion point of the silicon wafer. The temperature is typically limited by the high compressive mechanical stress induced in the silica films from the difference of thermal expansion between the silica films and the underlying silicon wafer. This temperature limitation results in silica films with undesirable residual infrared oscillators and in their associated undesirable residual optical absorption peaks in the 1.30 and 1.55 $\mu$m wavelength optical bands.

Thus, using a high temperature thermal treatment in the presence of nitrogen on the thirty-five products of silane and nitrous oxide given in FIG. 1, results in a maximum of only twelve of the thirty-five potential Si—O$_x$—H$_y$—N$_z$ products being converted to SiO$_2$. The same twelve compounds could also lead to the formation of SiO$_2$ in an inert (Ar) atmosphere or under vacuum, since in none of these twelve chemical reactions is nitrogen incorporated.

Following a high temperature thermal treatment in a nitrogen atmosphere, the other twenty-three Si—O$_x$—H$_y$—N$_z$ potential compounds can lead to the formation of: SiNH, SiN$_2$, SiOH$_2$, SiONH, and SiON$_2$. Therefore, high temperature thermal treatments under nitrogen, argon, or in a vacuum are incapable of transforming twenty-three potential initial Si—O$_x$—H$_y$—N$_z$ products formed from the reaction of silane and nitrous oxide into SiO$_2$. Thus, the silica films that result from these high temperature thermal treatments under nitrogen, argon, or in a vacuum are composed not only of SiO$_2$, but are solid mixtures of six possible compounds: SiO$_2$, SiNH, SiN$_2$, SiOH$_2$, SiONH and SiON$_2$. Gaseous by-products that result from the thermal decomposition of silica films are: nitrogen (N$_2$), hydrogen (H$_2$), and ammonia (NH$_3$).

FIG. 3 lists some FTIR fundamental infrared absorption peaks and their corresponding higher harmonic peaks associated with $SiO_2$, $SiNH$, $SiN_2$, $SiOH_2$, $SiONH$, and $SiON_2$. The higher harmonics of the absorption peaks corresponding to these six residual potential compounds contribute to the optical absorption in the 1.30 and 1.55 μm optical bands, as follows: the second vibration harmonics of the HO—H oscillators in trapped water vapour in the micro-pores of the silica films (3550 to 3750 $cm^{-1}$) increases the optical absorption near 1.333 to 1.408 μm; the second vibration harmonics of the SiO—H oscillators in the silica films (3470 to 3550 $cm^{-1}$) increases the optical absorption near 1.408 to 1.441 μm; the second vibration harmonics of the SiN—H oscillators in the silica films (3380 to 3460 $cm^{-1}$) increases the optical absorption near 1.445 to 1.479 μm; the second vibration harmonics of the SiN—H oscillators in the silica films (3300 to 3460 $cm^{-1}$) increases the optical absorption near 1.445 to 1.515 μm; the third vibration harmonics of the Si—H oscillators in the silica films (2210 to 2310 $cm^{-1}$) increases the optical absorption near 1.443 to 1.505 μm; the fourth vibration harmonics of the Si=O oscillators in the silica films (1800 to 1950 $cm^{-1}$) increases the optical absorption near 1.282 to 1.389 μm; and the fifth vibration harmonics of the N=N oscillators in the silica films (1530 to 1580 $cm^{-1}$) increases the optical absorption near 1.266 to 1.307 μm. The negative effects of these the oscillators on the optical properties of silica films are reported in the literature.

Thus, this high temperature thermal treatment of silica films under vacuum, argon, or nitrogen, does not provide a very efficient way to eliminate the excessive absorption at various wavelengths in the 1.30 and 1.55 μm optical bands.

SUMMARY OF THE INVENTION

An object of the invention is to alleviate the aforementioned problems.

In one aspect, the invention provides a method of making a high optical quality silica film, comprising: subjecting a substrate to a gaseous mixture of silane and nitrous oxide to deposit said film on said substrate in accordance with the reaction

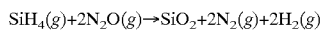

$$SiH_4(g)+2N_2O(g) \rightarrow SiO_2+2N_2(g)+2H_2(g)$$

and subsequently subjecting said deposited film to a reactive atmosphere containing hydrogen and oxygen atoms to chemically transform impurities resulting from the reaction into pure silica.

In another aspect the invention provides a method for reducing the optical absorbance of a silica film coated on a substrate, comprising: subjecting the silica film coated on the substrate to a temperature of about 600° to about 1000° C. under nitrogen, an inert atmosphere, or under vacuum; increasing the temperature to a maximum temperature of at most 1350° C.; exposing the silica film to a reactive atmosphere comprising oxygen and hydrogen atoms by replacing the nitrogen, inert atmosphere or vacuum by the reactive atmosphere; removing the silica film from the reactive atmosphere by replacing the reactive atmosphere with nitrogen, an inert atmosphere, or vacuum; decreasing the temperature from the maximum temperature to about 1000° to about 600° C.; and recovering the silica film coated on the substrate.

BRIEF DESCRIPTION OF THE DRAWINGS

The invention will now be described in more detail, by way of example, with reference to the accompanying drawings, in which:

FIG. 1 is a table of thirty-five compounds that could be found in silica films as a result of chemical reactions in a silane ($SiH_4$) and nitrous oxide ($N_2O$) gas mixture;

FIG. 2 is a table of the possible chemical reactions that may ensue from exposure of the thirty-five of FIG. 1 compounds to nitrogen at very high temperature;

FIG. 3 is a table of the FTIR fundamental infrared absorption peaks and their corresponding higher harmonics peaks associated with the six residual potential compounds that result from a high temperature thermal treatment of silica films under nitrogen, argon, or under vacuum;

FIG. 4 is a table of the possible chemical reactions that may result from the exposure of the thirty-five potential compounds to a gas mixture of hydrogen ($H_2$), oxygen ($O_2$), water vapour ($H_2O$), at very high temperature;

DESCRIPTION OF PREFERRED EMBODIMENTS OF THE INVENTION

Figure 5:
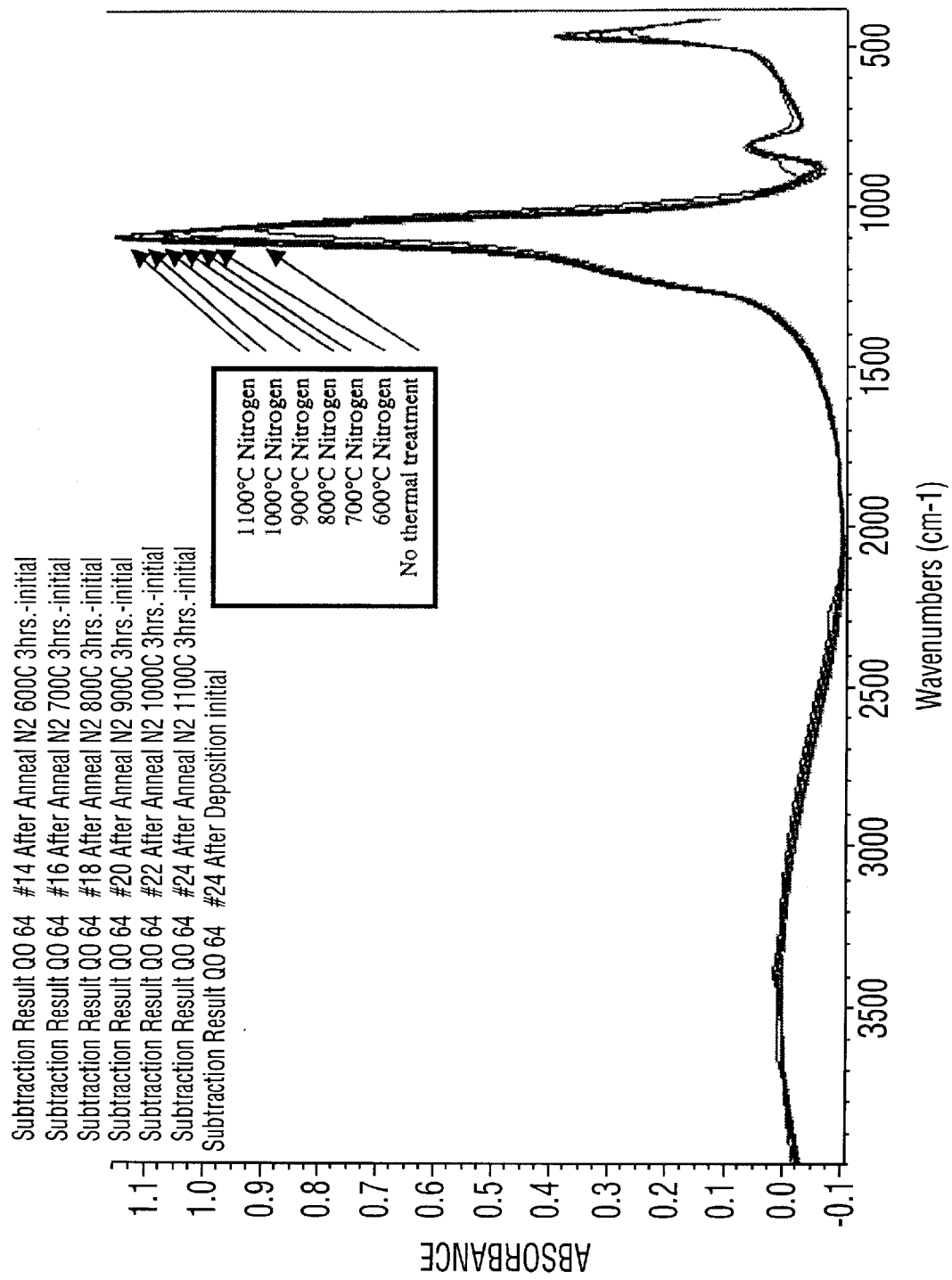
FIG. 5 is the FTIR spectra of PECVD silica films before and after a three hours long high temperature thermal treatment in a nitrogen ambient at a temperature of either 600°, 700°, 800°, 900°, 1000°, or 1100° C.

The method of this invention comprises subjecting a silica film, coated on a substrate, to three stages: a first dry stage, a wet stage, and a second dry stage. During the two dry stages the silica film deposited on a substrate is subject to high temperatures under a nitrogen or inert atmosphere, or under vacuum. During the wet stage the "dry" atmosphere is replaced by a "wet" atmosphere comprising a mixture of hydrogen gas and oxygen gas which also produces, by thermal decomposition at such a high temperature, some water vapour ($2H_2+O_2 \rightarrow 2H_2O$). These reactive gases, $H_2$, $O_2$, and $H_2O$, are at the basis for the elimination of the undesirable oscillators of the various side-products of FIG. 1 and of the achievement of extremely high quality optical silica films.

As discussed above, silica films deposited onto a substrate from a silane and nitrous oxide gas mixture at low temperature contain a mixture of silicon dioxide and up to 35 undesirable Si—$O_x$—$H_y$—$N_z$ compounds listed in FIG. 1. FIG. 4 lists the possible chemical reactions that may result from the exposure of the thirty-five potential compounds to a gas mixture composed of hydrogen, oxygen, and water vapor at very high temperature. As shown in FIG. 4, each one of the thirty-five Si—$O_x$—$H_y$—$N_z$ potential compounds can lead to the formation of pure $SiO_2$ after a high temperature chemical treatment in a gas mixture composed of hydrogen, oxygen, and water vapor at very high temperature. Thus, the silica films that result from these high temperature chemical treatments are potentially pure $SiO_2$. FTIR spectra can be used to monitor the transformation of these treated silica films into pure $SiO_2$.

The high temperature chemical treatment method of the invention is preferably carried out in a vertical or horizontal diffusion furnace, more preferably in a BTI horizontal furnace.

The substrate is preferably a wafer of 100 mm, 125 mm, 150 mm, 200 mm, or 300 mm, more preferably of 150 mm. The substrate may be glass, quartz, alumina, silicon, sapphire, or other refractory materials that can sustain the high temperature treatment. Preferably the substrate is silicon.

First "dry" stage: With regard to the first "dry" stage, the silica film coated on a substrate is preferably loaded into a diffusion furnace idling at high temperature, preferably between 600° and 1000° C., more preferably at 700° C. The silica film coated on a substrate is preferably loaded within 5 to 120 minutes, more preferably within 15 minutes. The silica film coated on a substrate is preferably loaded under a nitrogen or argon flow, more preferably nitrogen, at a flow rate of 1 to 100 liters of argon or nitrogen per minute, more preferably at a flow rate of about 10 liters/minute.

The temperature to which the silica film is subject is increased to a maximum temperature. Preferably this temperature increase is performed a rate of 2.5 to 20° C./minute, more preferably at about 5° C./minute.

The maximum temperature to which the silica film is subjected according the method of the invention is preferably 600° C. to 1350° C., more preferably 800° C. to 1200° C. The silica film is preferably allowed to stabilise at the maximum temperature under the argon or nitrogen atmosphere or under vacuum for 10 to 120 minutes, more preferably about 30 minutes.

"Wet" stage: With regard to the "wet" stage, the reactive atmosphere preferably comprises a mixture of between 1.0 and 20.0 liter/minute of oxygen and between 1.0 and 30.0 liter/minute of hydrogen is preferred, more preferably the mixture is about 4.4 liter/minute of oxygen and about 7.5 liter/minute of hydrogen. Alternatively, the reactive atmosphere may comprise gases, other than hydrogen ($H_2$) and oxygen ($O_2$), which contain hydrogen and oxygen atoms. Examples include water vapour ($H_2O$), hydrogen peroxide ($H_2O_2$), and nitric acid ($HNO_3$). These other gases may be used at a gas flow rate of between 1.0 and 20.0 liter/minute.

The silica film is preferably allowed to be exposed to these reactive conditions from 30 minutes to 600 minutes, more preferably about 120 minutes.

Second "dry" stage: With regard to the second "dry" stage, the reactive gas may be replaced by a nitrogen or argon flow, more preferably nitrogen, at a flow rate of 1 to 100 liters of argon or nitrogen per minute, more preferably at a flow rate of about 10 liters/minute.

The silica film is preferably allowed to stabilise at the maximum temperature under the argon or nitrogen atmosphere or under vacuum for 10 to 120 minutes, more preferably about 30 minutes.

The temperature to which the silica film is subject is decreased to a temperature of about 1000° to 600° C. Preferably this temperature decrease is performed a rate of 1 to 10° C./minute, more preferably at about 2.5° C./minute.

The silica film coated on a substrate is preferably recovered from a diffusion furnace at a temperature of between 600 and 1000° C., more preferably at 700° C. The silica film coated on a substrate is preferably recovered from a diffusion furnace within 5 to 120 minutes, more preferably within 15 minutes. The silica film coated on a substrate is preferably recovered from under a flow of nitrogen or argon, preferably nitrogen, at a flow rate of 1 to 100 liters of argon or nitrogen per minute, more preferably at a flow rate of about 10 liters/minute.

For the purpose of manufacturing optical devices which employ silica waveguides, such as optical Multiplexers (Mux) and Demultiplexers (Dmux), the method of this invention is preferably used to reduce absorbance in the 1.30 and 1.55 $\mu$m optical regions. However, the method of this invention is not limited to the 1.30 and 1.55 $\mu$m optical regions since the higher oscillation harmonics of the eliminated oscillators using the chemical treatment of this invention have other optical benefits at longer or shorter wavelengths. This invention also preferably encompasses the first, second, third, and fourth harmonics of these oscillators.

The silica films coated on the substrate used in this invention may be prepared in a manner known in the art. The silica films are usually deposited by plasma enhanced chemical vapor deposition (PECVD). However, they may also be deposited by flame hydrolysis (FH), low pressure chemical vapor deposition (LPCVD), metal organic vapor deposition (MOCVD), electron cyclotron resonance deposition (ECRD), or by RF sputtering (RFS).

The PECVD silica films could be deposited at a range of temperatures known to one skilled in the art. Preferably the silica films are deposited at about 400° C.

The silica films are preferably un-doped, but may be doped with phosphorus, boron, germanium, or titanium.

The silica films of this invention may be used for a number of purposes including Mux/Dmux devices, other photonics devices, semiconductor devices, microelectromechanical systems (MEMS), bio-chips, lab-on-a-chip devices, and multi-chips modules.

COMPARATIVE EXAMPLE

Un-doped PECVD silica films were subject to a maximum temperature of between 800° C. and 1200° C. in a BTI 150 mm horizontal diffusion furnace using a Dry—Dry—Dry three step chemical treatment process. The three steps are as follows.

Dry: The silicon wafers, coated with the required combinations of PECVD silica films, were loaded in a diffusion furnace idling at 700° C. within 15 minutes under 10 liter/minute of nitrogen gas flow. This was followed by a ramp-up of the furnace temperature at a rate of 5° C./minute from 700° C. to the maximum thermal treatment temperature under the same 10 liter/minute of nitrogen gas flow. The silicon wafers were allowed to stabilise for 30 minutes at the maximum thermal treatment temperature under 10 liter/minute of nitrogen gas flow.

Dry: While at the maximum thermal treatment temperature, the 10 liter/minute of nitrogen was maintained and the silicon wafers were allowed to stabilise for 120 minutes at this maximum thermal treatment temperature.

Dry: The 10 liter/minute of nitrogen gas flow was maintained and the silicon wafers were allowed to stabilise for 30 minutes at the maximum thermal treatment temperature. This was followed by a ramp-down of the furnace temperature at a rate of 2.5° C./minute from the maximum thermal treatment temperature to 700° C. under the 10 liter/minute of nitrogen gas flow. The thermally treated PECVD silica films were then unloaded under the 10 liter/minute of nitrogen gas flow within 15 minutes.

FIG. 5 shows the basic FTIR spectra of PECVD silica films before and after a three hour long high temperature thermal treatment in a nitrogen ambient at a maximum temperature of 600°, 700°, 800°, 900°, 1000°, or 1100° C. It is clear that the higher the thermal decomposition temperature of the high temperature thermal treatment in a nitrogen ambient, the better the thermal decomposition of silica films, the better the elimination of nitrogen, hydrogen, and ammonia (i.e. as per the chemical reactions of FIG. 1) and the better the FTIR spectra of the treated silica films (i.e. the better the four basic optical absorption peaks). The spectra of FIG. 5 include several peaks: a more intense and smaller FWHM Si—O—Si "rocking mode" absorption peak ranging between 410 and 510 $cm^{-1}$; a smaller FWHM Si—O—Si "bending mode" absorption peak ranging between 740 and 880 $cm^{-1}$; a more intense and smaller FWHM Si—O—Si "in-phase-stretching mode" absorption peak ranging between 1000 and 1160 $cm^{-1}$, indicating a more stoichiometric silica films with the optimum density and optimum Si—O—Si bond angle of 144°; a gradual elimination of the Si—O—Si "out-of-phase-stretching mode" absorption peak ranging between 1080 and 1280 $cm^{-1}$, as compared to the Si—O—Si in-phase-stretching mode absorption peak; a gradual separation between the Si—O—Si "in-phase-stretching mode" absorption peak (1080 $cm^{-1}$) and the Si—O—Si "bending mode" absorption peak (810 $cm^{-1}$) with a deeper valley between 850 and 1000 $cm^{-1}$.

Figure 6:
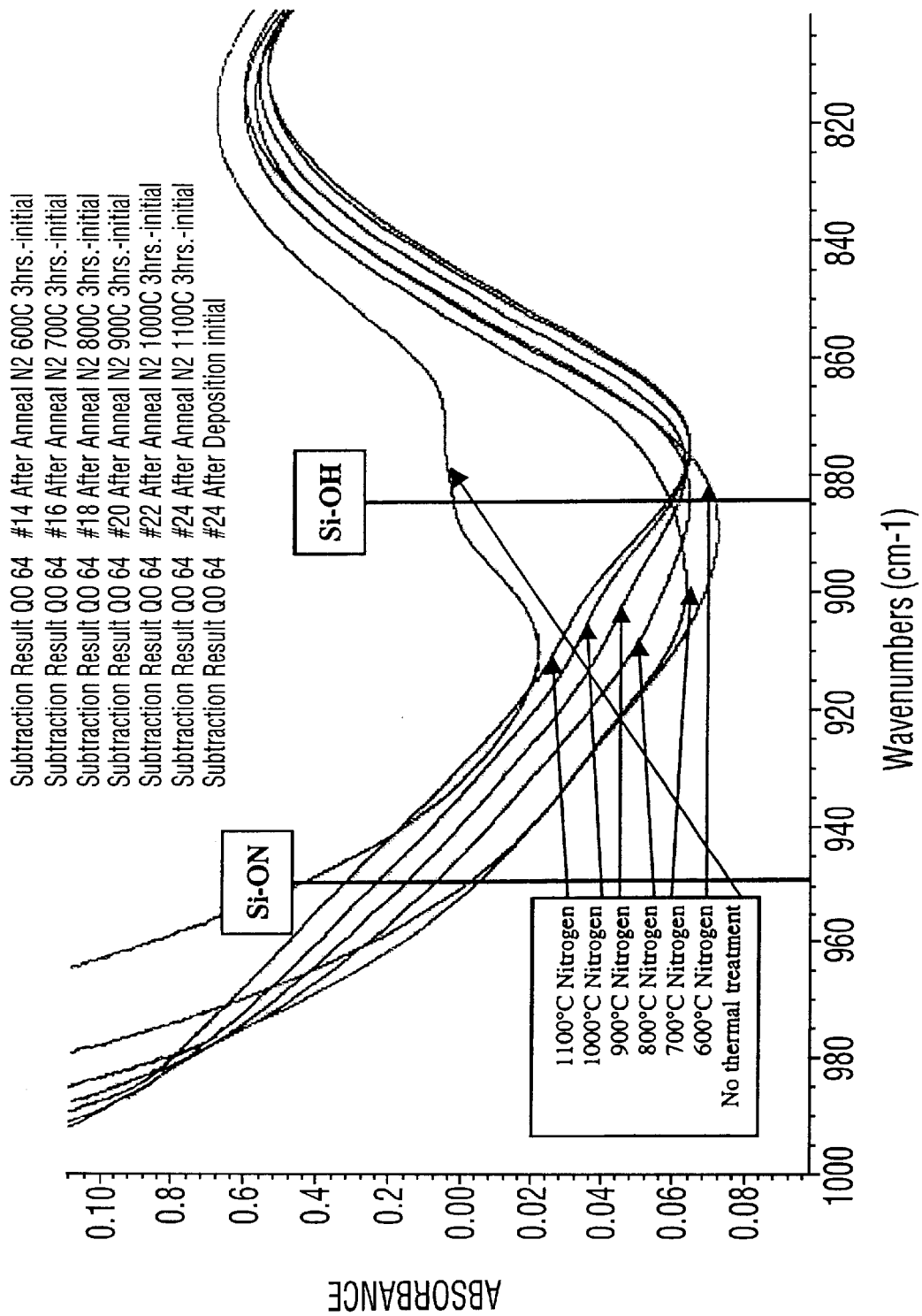
FIG. 6 is an expanded view of the FTIR spectra of FIG. 5 in the region between 810 to 1000 $cm^{-1}$.

From the FTIR spectra from 810 to 1000 $cm^{-1}$ of FIG. 6 it is clear that the higher the thermal decomposition temperature, the better the net separation between the Si—O—Si "in-phase-stretching mode" absorption peak (1080 $cm^{-1}$) and the Si—O—Si "bending mode" absorption peak (810 $cm^{-1}$) and the deeper the valley between 850 and 1000 $cm^{-1}$. The reduction and gradual elimination of the Si—OH oscillators, centered at 885 $cm^{-1}$ (i.e. of some configurations of the $SiOH_2$ residual potential compounds) using various chemical reactions of FIG. 2 was demonstrated to occur following the 600° C. thermal treatment in a nitrogen ambient. A residual peak was observed at 950 $cm^{-1}$, indicating the presence of residual oscillators as a result of the various thermal decomposition reactions of FIG. 2. These residual oscillators are associated to the Si—ON oscillators of two (2) of the six (6) residual potential compounds: SiONH and $SiON_2$. The higher the temperature, the more nitrogen incorporation and the more evident the Si—ON oscillators (i.e. some configurations of the residual potential: SiONH and/or $SiON_2$ compounds).

Figure 7:
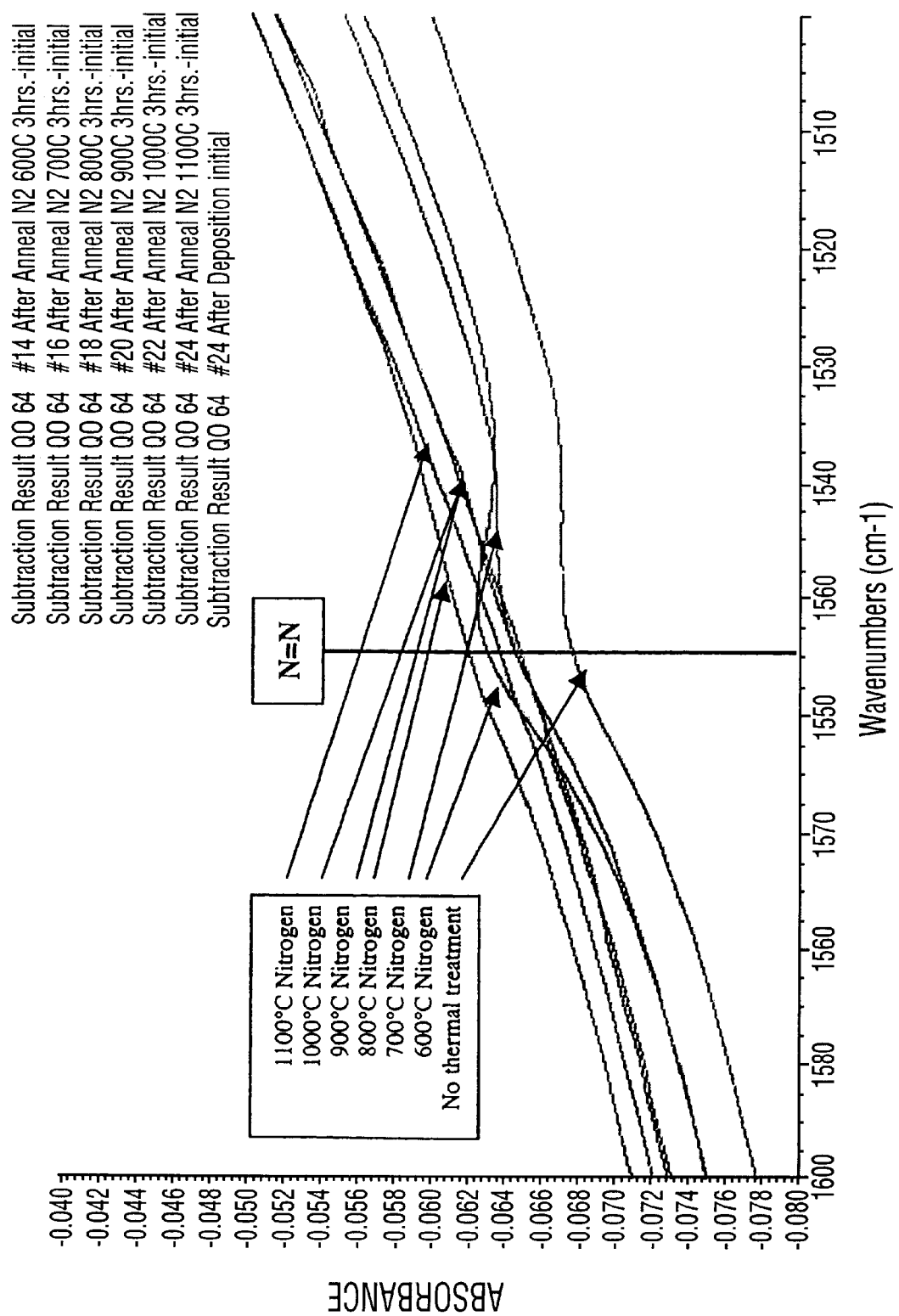
FIG. 7 is an expanded view of the FTIR spectra of FIG. 5 in the region between 1500 to 1600 $cm^{-1}$.

The region from 1500 to 1600 $cm^{-1}$ of FIG. 7 focuses on the N=N oscillators, centered at 1555 $cm^{-1}$, of the various compounds described by the various chemical reactions of FIG. 2. It is clear that the higher the temperature, the better the elimination of N=N oscillators (which fifth harmonics could cause an optical absorption between 1.266 and 1.307 $\mu$m) with a complete elimination of residual N=N oscillators (i.e. some configurations of the residual potential $SiON_2$ compounds) after a thermal treatment beyond 900° C. in a nitrogen ambient.

Figure 8:
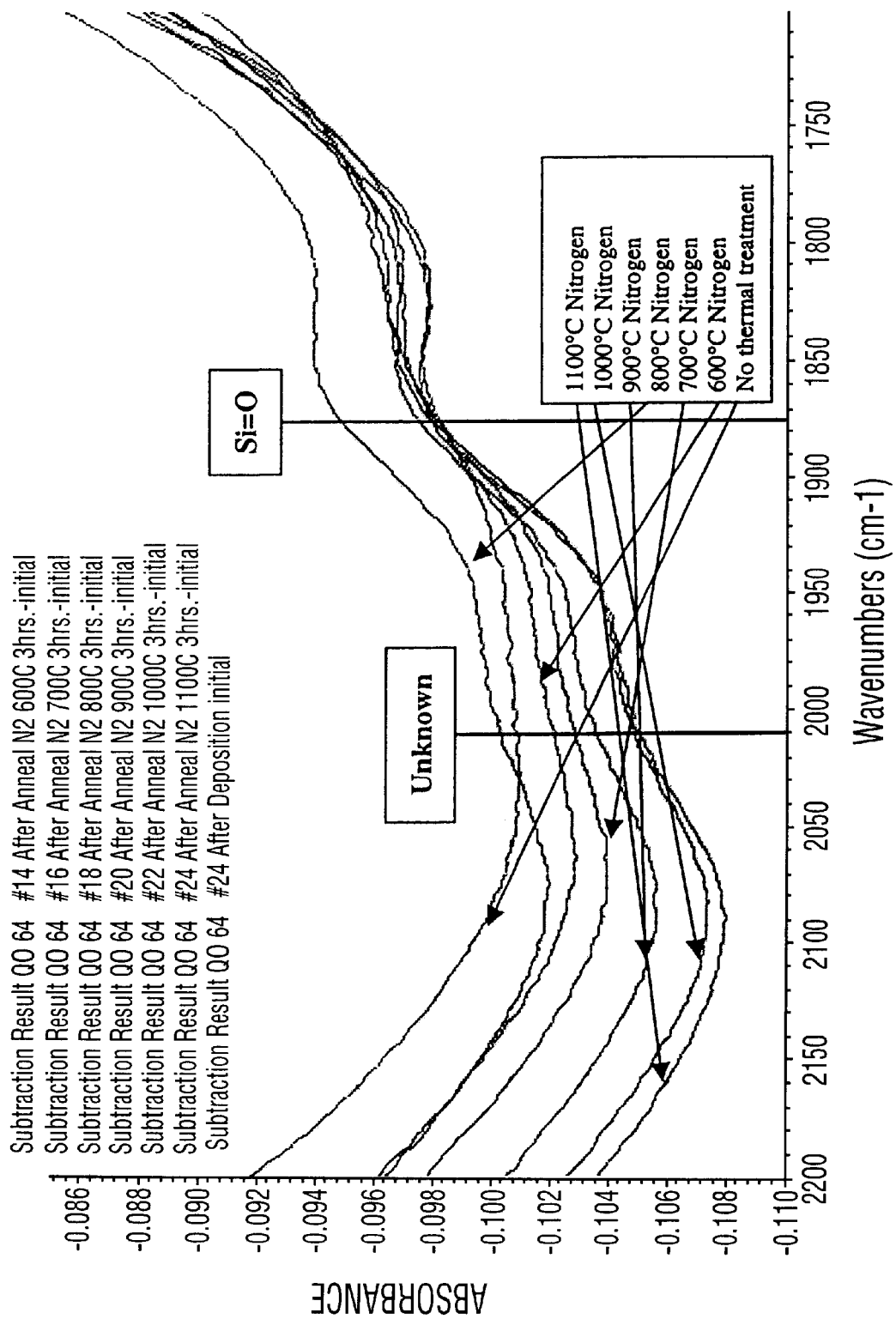
FIG. 8 is an expanded view of the FTIR spectra of FIG. 5 in the region between 1700 to 2200 $cm^{-1}$.

The region from 1700 to 2200 $cm^{-1}$ of FIG. 8 focuses on the Si=O oscillators, centered at 1875 $cm^{-1}$ of four (4) of the six (6) residual potential compounds: $SiO_2$, $SiOH_2$, SiONH and $SiON_2$. Another unknown absorption peak was also observed centered at 2010 $cm^{-1}$ but since this unknown oscillator does not have a higher harmonics which could cause optical absorption in the 1.30 and 1.55 $\mu$m optical bands, the search of its identity was not prioritized. It is clear that the higher the thermal decomposition temperature, the more evident the Si=O oscillators (which fourth harmonics could cause an optical absorption between 1.282 and 1.389 $\mu$m) and the more evident the unknown oscillators which have no higher absorption harmonics between 1.300 and 1.550 $\mu$m.

Figure 9:
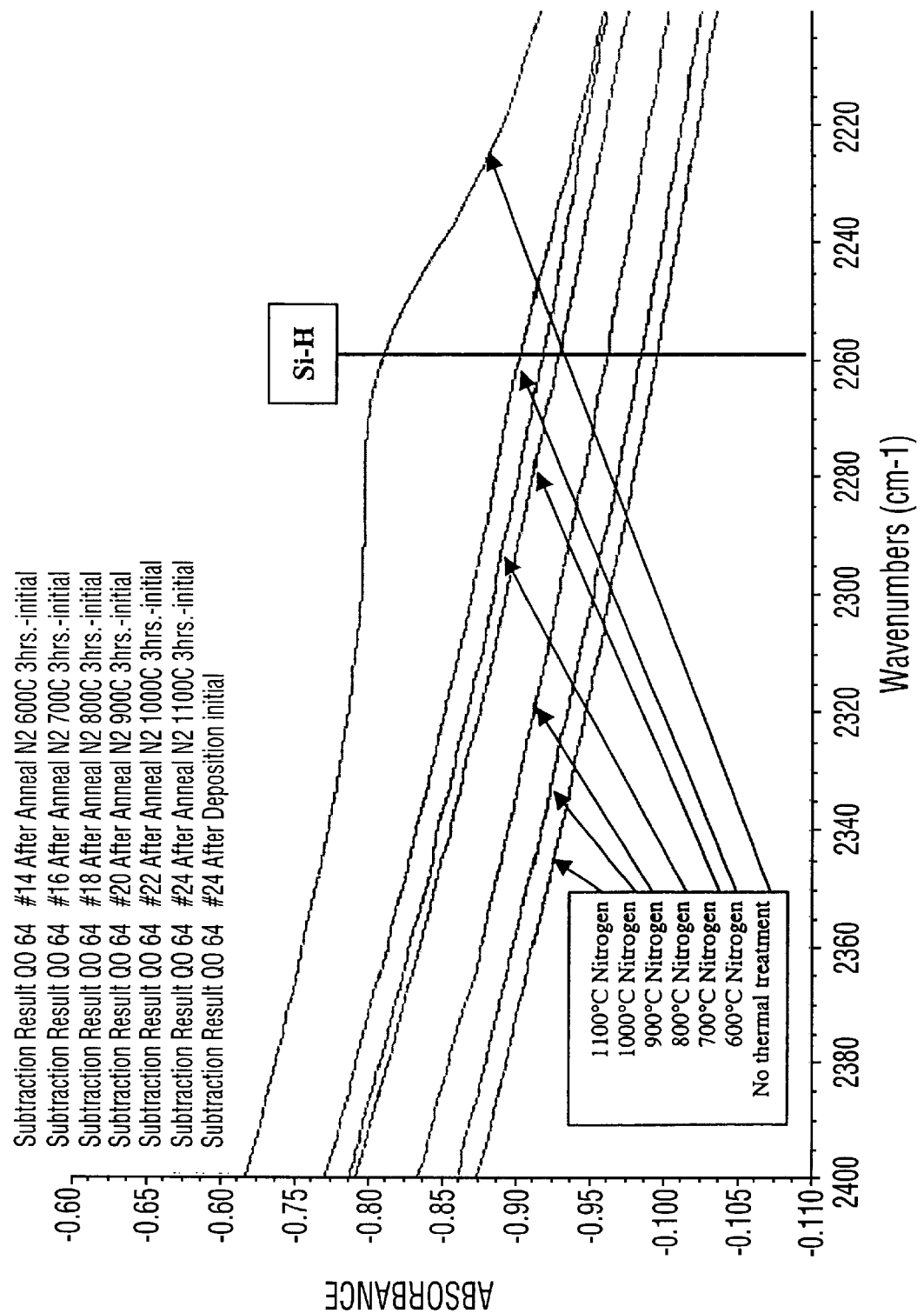
FIG. 9 is an expanded view of the FTIR spectra of FIG. 5 in the region between 2200 to 2400 $cm^{-1}$.

FIG. 9 show the in-depth FTIR spectra from 2200 to 2400 $cm^{-1}$. This region of interest focuses on the Si—H oscillators, centered at 2260 $cm^{-1}$ of three of the six residual potential compounds: SiNH, $SiOH_2$, and SiONH. It was noted that the higher the thermal decomposition temperature, the better the elimination of Si—H oscillators (which third harmonics could cause an optical absorption between 1.443 and 1.508 $\mu$m) with a complete elimination of residual Si—H oscillators (i.e. some configurations of the residual potential SiNH, $SiOH_2$, and SiONH compounds) after a thermal treatment beyond 600° C. in a nitrogen ambient.

Figure 10:
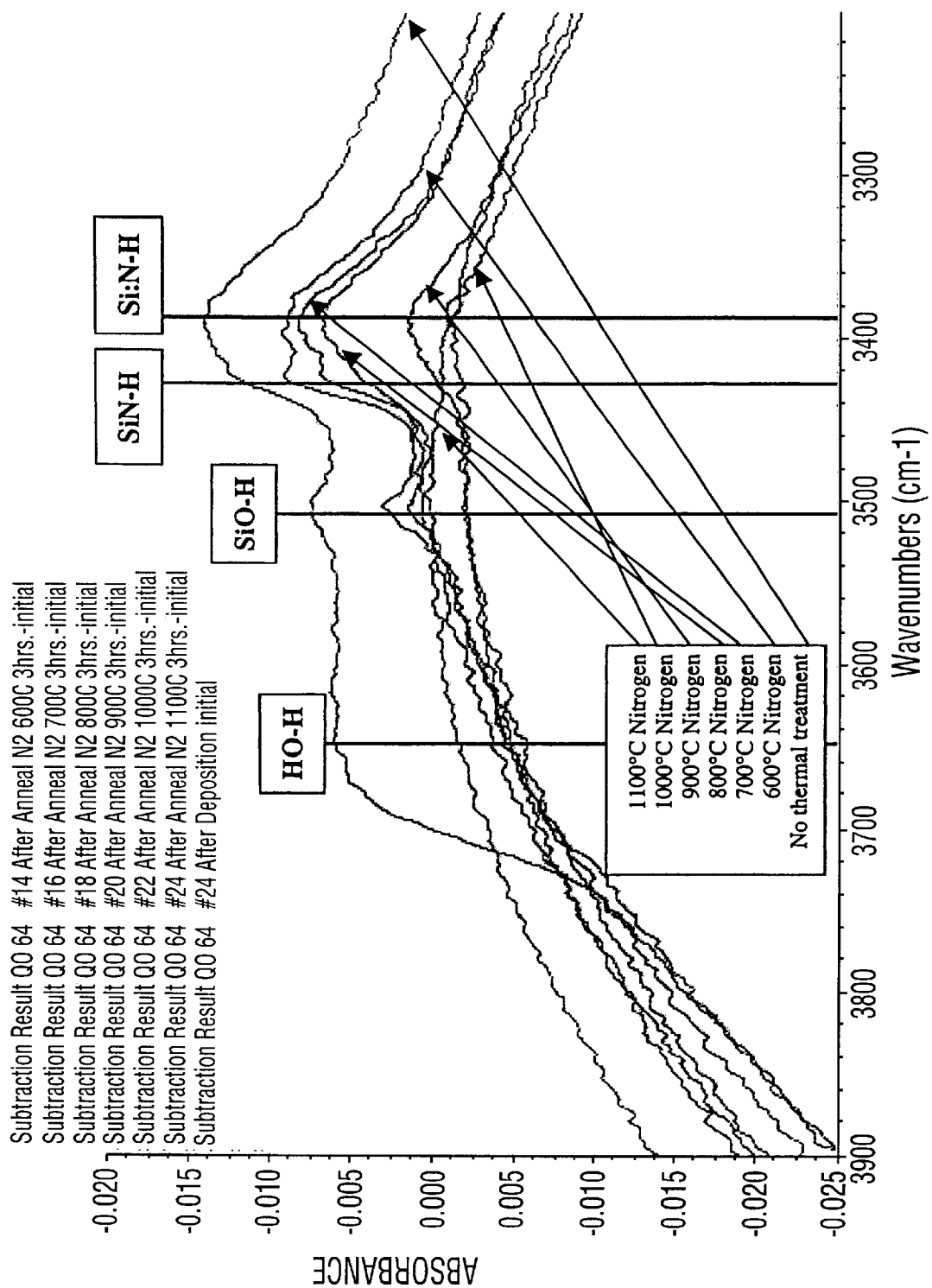
FIG. 10 is an expanded view of the FTIR spectra of FIG. 5 in the region between 3200 to 3900 $cm^{-1}$.

FIG. 10 shows the in-depth FTIR spectra from 3200 to 3900 $cm^{-1}$. This region of interest focuses on the Si:N—H oscillators, centered at 3380 $cm^{-1}$, the SiN—H oscillators, centered at 3420 $cm^{-1}$, the SiO—H oscillators, centered at 3510 $cm^{-1}$, and the HO—H oscillators, centered at 3650 $cm^{-1}$ of three of the six residual potential compounds: SiNH, $SiOH_2$ and SiONH. It is clear that the higher the thermal decomposition temperature, the better the elimination of: the HO—H oscillators (trapped water vapour in the micro-pores of the silica films and which second harmonics could cause an optical absorption between 1.333 and 1.408 $\mu$m) with a complete elimination over 600° C.; the SiO—H oscillators (which second harmonics could cause an optical absorption between 1.408 and 1.441 $\mu$m) with a complete elimination over 900° C.; the SiN—H oscillators (which second harmonics could cause an optical absorption between 1.445 and 1.479 $\mu$m)) with a complete elimination over 1000° C.; and the Si:N—H oscillators (which second harmonics could cause an optical absorption between 1.445 and 1.515 $\mu$m) with are not yet completely eliminated at 1100° C. The complete elimination of the SiN—H oscillators is extremely difficult because the nitrogen atom is bonded to the silicon atom of the $SiO_2$ network with two covalent bonds.

This comparative experiment demonstrates that it is very difficult to use the "dry—dry—dry" method in order to completely eliminate the residual oscillators of various undesirable $Si—O_x—H_y—N_z$ potential compounds and achieve optical quality silica films from PECVD silica films using a simple thermal decomposition thermal treatment at temperature between 600 and 1100° C.

EXAMPLE 1

UN-doped PECVD silica films were subject to a maximum temperature of between 800° C. and 1200° C. in a BTI 150 mm horizontal diffusion furnace using a Dry-Wet-Dry three step chemical treatment process:

Dry: The silicon wafers, coated with the required combinations of PECVD silica films, were loaded into a diffusion furnace idling at 700° C. within 15 minutes under 10 liter/minute of nitrogen gas flow, followed by a ramp-up of the furnace temperature at a rate of 5° C./minute from 700° C. to the maximum thermal treatment temperature under the same 10 liter/minute of nitrogen gas flow and by a stabilisation for 30 minutes at the maximum thermal treatment temperature under the 10 liter/minute of nitrogen gas flow;

Wet: While at the maximum thermal treatment temperature, the 10 liter/minute of nitrogen gas flow was replaced by a reactive gas flow composed of 4.38 liter/minute of oxygen and 7.5 liter/minute of hydrogen and stabilised for 120 minutes in this gas mixture at a maximum thermal treatment temperature;

Dry: The oxygen/hydrogen gas mixture was replaced by a 10 liter/minute of nitrogen gas flow, followed by a stabilisation at the maximum thermal treatment temperature for 30 minutes under the 10 liter/minute of nitrogen gas flow, followed by a ramp-down of the furnace temperature at a rate of 2.5° C./minute from the maximum thermal treatment temperature to 700° C. under the 10 liter/minute of nitrogen gas flow, followed by the unloading of the thermally treated combination of PECVD silica films under the 10 liter/minute of nitrogen gas flow within 15 minutes.

Figure 11:
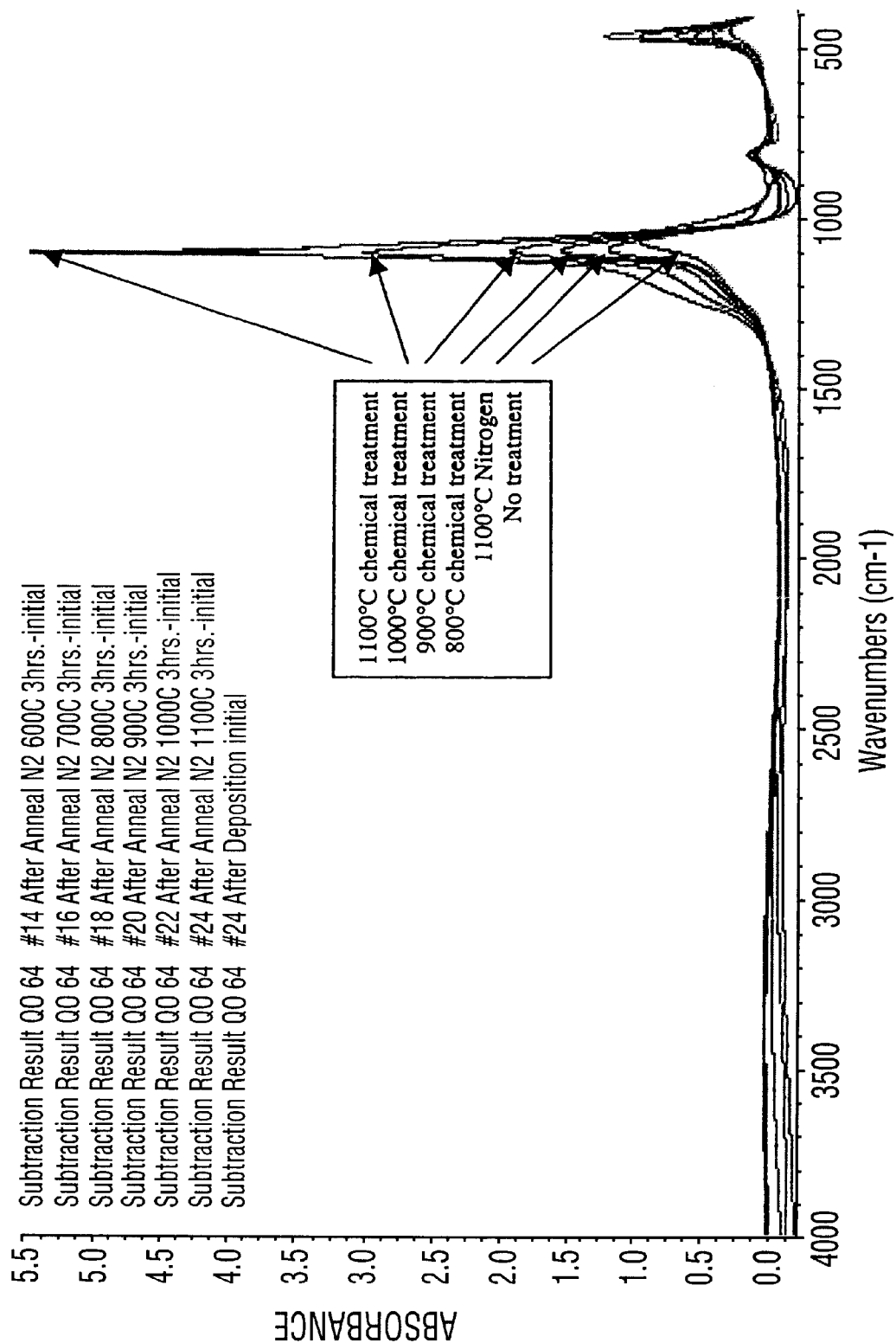
FIG. 11 is the FTIR spectra of PECVD silica films before and after a three hour long high temperature chemical treatment in a $H_2$, $O_2$, and $H_2O$ atmosphere at a temperature of 800°, 900°, 1000°, or 1100° C. Comparison is made to the FTIR spectrum of PECVD silica films after a three hour high temperature thermal treatment under nitrogen (described in Comparative Example 1), at a temperature of 1100° C.

FIG. 11 shows the basic FTIR spectra of PECVD silica films before and after a three hour long high temperature chemical treatment in a $H_2$, $O_2$, and $H_2O$ ambient at a temperature of either 800°, 900°, 1000°, or 1100° C. as well as after a three hour long high temperature thermal treatment in a $N_2$ ambient at a temperature of 1100° C. from the comparative example described above. It is clear that the higher the temperature, the better the elimination of: nitrogen, hydrogen, and ammonia (i.e. as per the chemical reactions of FIG. 4), and the better the FTIR spectra of the treated silica films (i.e. the better the four basic optical absorption peaks). Thus, FIG. 11 shows a much more intense and smaller FWHM Si—O—Si "rocking mode" absorption peak (between 410 and 510 $cm^{-1}$) with the lowest temperature chemical treatment of 800° C. showing a more intense and smaller FWHM Si—O—Si "rocking mode" absorption peak then the best result achieved with the thermal treatment of the comparative example at 1100° C.; a more intense and smaller FWHM Si—O—Si "bending mode" absorption peak (between 740 and 880 $cm^{-1}$) with the lowest temperature chemical treatment of 800° C. showing a more intense and smaller FWHM Si—O—Si "bending mode" absorption peak than the best result achieved with the thermal treatment at 1100° C.; a much more intense and smaller FWHM Si—O—Si "in-phase-stretching mode" absorption peak (between 1000 and 1160 $cm^{-1}$) indicating a more stoichiometric silica film with the optimum density and optimum Si—O—Si bond angle of 144° with the lowest temperature chemical treatment of 800° C. showing a more intense and smaller FWHM Si—O—Si "in-phase-stretching mode" absorption peak then the best result achieved with the thermal treatment at 1100° C.; a gradual and impressive elimination of the Si—O—Si "out-of-phase-stretching mode" absorption peak (between 1080 and 1280 $cm^{-1}$), as compared to the Si—O—Si in-phase-stretching mode absorption peak with the lowest temperature chemical treatment of 800° C. showing a more complete elimination of the Si—O—Si "out-of-phase-stretching mode" absorption peak than the best result achieved with the thermal treatment at 1100° C.; a very clean separation between the Si—O—Si "in-phase-stretching mode" absorption peak (1080 $cm^{-1}$) and the Si—O—Si "bending mode" absorption peak (810 $cm^{-1}$) with a very deep valley between 850 and 1000 $cm^{-1}$ with the lowest temperature chemical treatment of 800° C. showing a better separation between the Si—O—Si "in-phase-stretching mode" absorption peak and the Si—O—Si "bending mode" absorption peak and a deeper valley between 850 and 1000 $cm^{-1}$ and the best result achieved with the thermal treatment at 1100° C.

A close-up of some infrared regions of the FTIR spectra of FIG. 11 with the help of the FTIR regions of the table of FIG. 3 verifies the elimination of the various Si—$O_x$—$H_y$—$N_z$ potential compounds and verifies the achievement of pure $SiO_2$ with minimum optical absorption in the 1.30 and 1.55 µm optical bands.

Figure 12:
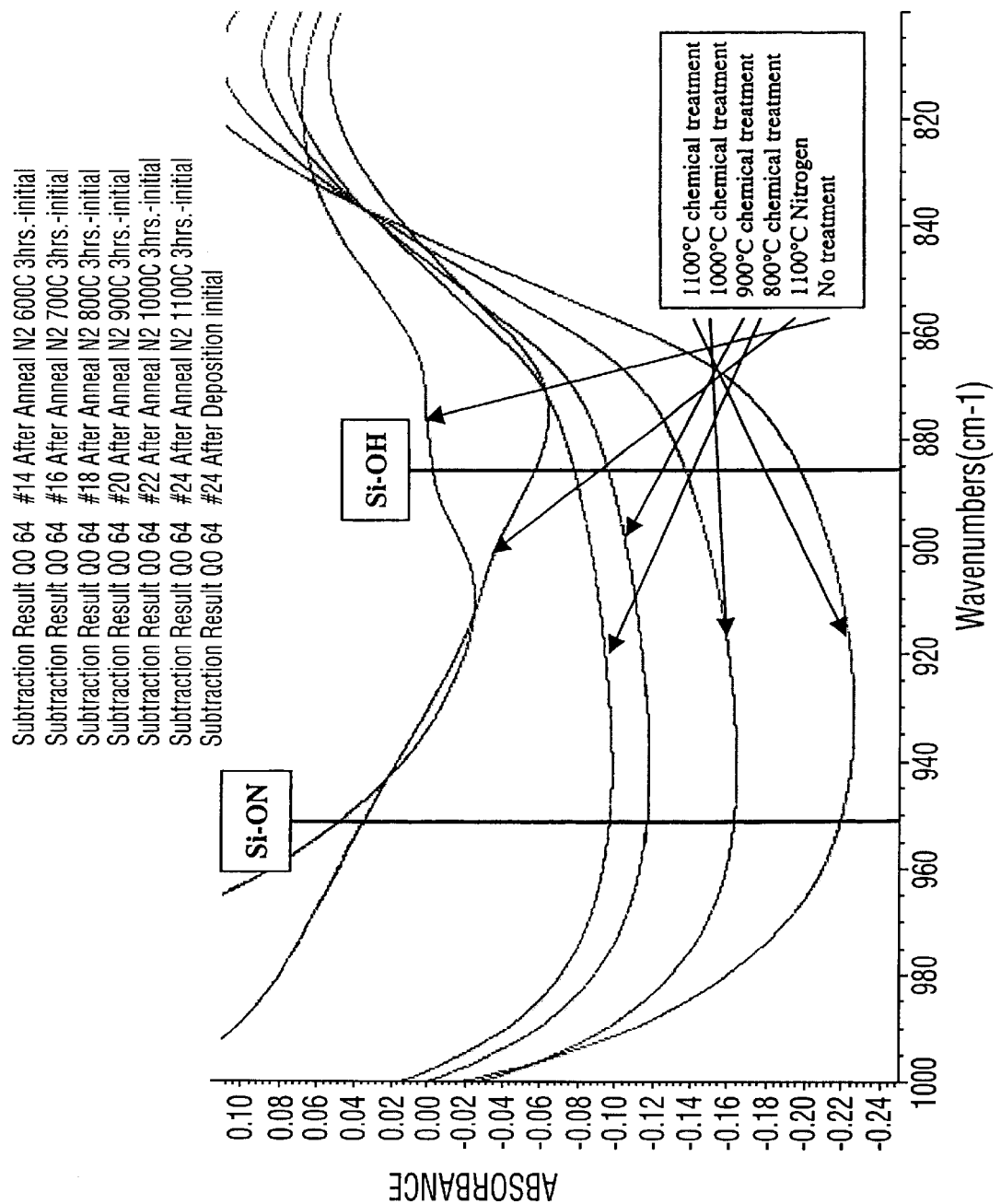
FIG. 12 is an expanded view of the FTIR spectra of FIG. 11 in the region between 810 to 1000 $cm^{-1}$.

FIG. 12 shows a close-up of the FTIR spectra from 810 to 1000 $cm^{-1}$. It is clear that the higher the temperature, the better the net separation between the Si—O—Si "in-phase-stretching mode" absorption peak (1080 $cm^{-1}$) and the Si—O—Si "bending mode" absorption peak (810 $cm^{-1}$) and the deeper the valley between 850 and 1000 $cm^{-1}$. The reduction and total elimination of the Si—OH oscillators (centered at 885 $cm^{-1}$) using various chemical reactions of FIG. 4 is more complete as the temperature of the chemical treatment is increased. In fact, it is demonstrated that the elimination of the Si—OH oscillators is even more complete with the lowest temperature chemical treatment of 800° C. than with the best thermal treatment at 1100° C. Similarly, the gradual reduction and elimination of the Si—ON oscillators (centered at 950 $cm^{-1}$) using various chemical reactions of FIG. 4 is more complete as the temperature of the chemical treatment is increased. Unlike the thermal treatment in nitrogen of the comparative example which tends to incorporate more nitrogen and form more Si—ON oscillators (i.e. more residual potential SiONH and/or $SiON_2$ compounds) as the temperature of the thermal treatment is increased, the chemical treatment of the invention eliminates more and more of the Si—ON oscillators as the temperature of the chemical treatment is increased. Again, it is demonstrated that the elimination of the Si—ON oscillators is even more complete with the lowest temperature chemical treatment of 800° C. than with the best thermal treatment at 1100° C. The net separation and deep valley indicate that the silica films resulting from these high temperature chemical treatments are composed of high quality $SiO_2$ material.

Figure 13:
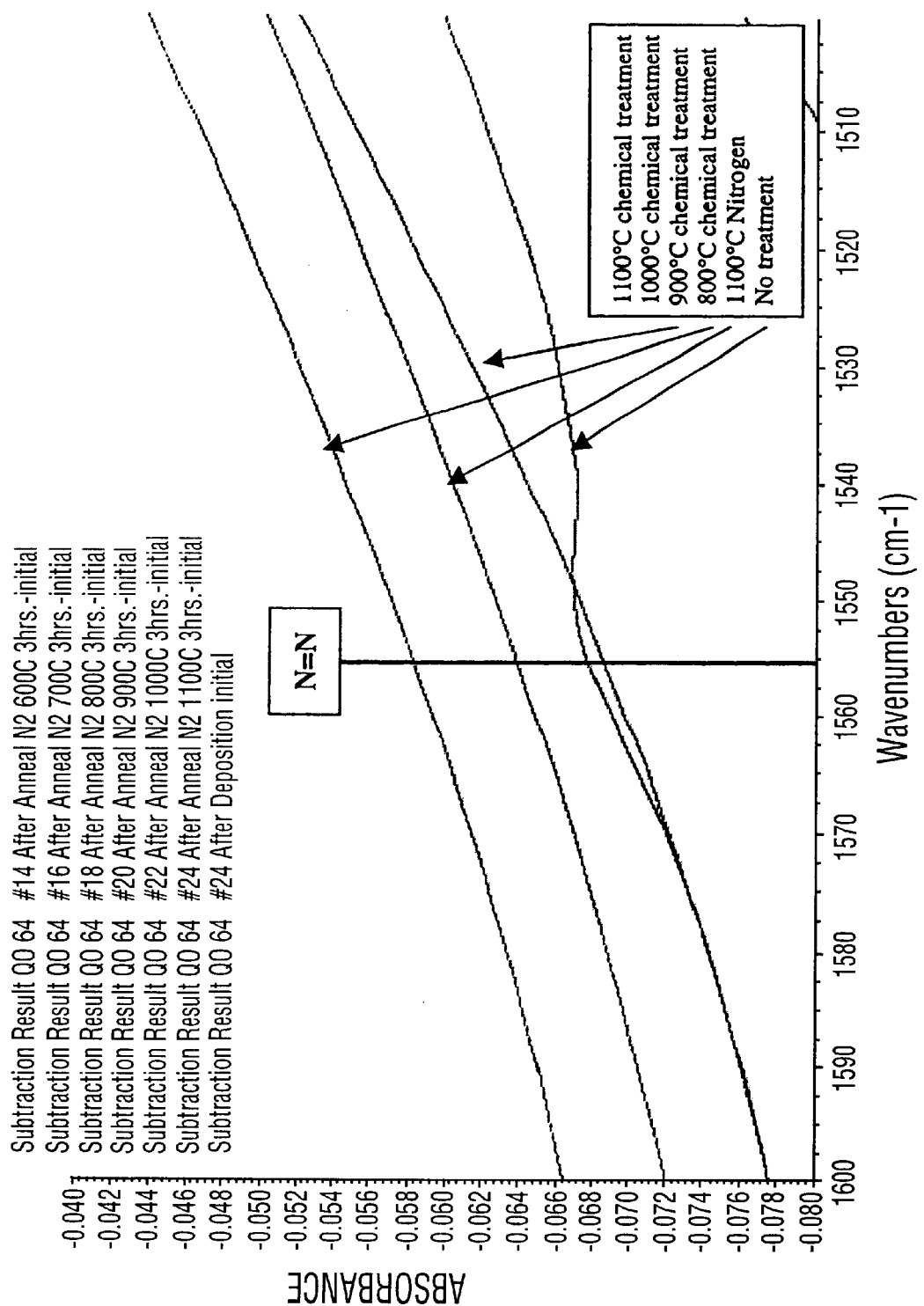
FIG. 13 is an expanded view of the FTIR spectra of FIG. 11 in the region between 1500 to 1600 $cm^{-1}$.

FIG. 13 shows a close-up of the FTIR spectra from 1500 to 1600 $cm^{-1}$. This region of interest focuses on the N=N oscillators (centered at 1555 $cm^{-1}$ and which fifth harmonics could cause an optical absorption between 1.266 and 1.307 µm) of the various compounds described by the various chemical reactions of FIG. 4. It is clear that these oscillators are completely eliminated by the high temperature chemical treatments and that a chemical treatment at a temperature of 800° C. is as efficient as the best thermal treatment at 1100° C. for the elimination of residual N=N oscillators.

Figure 14:
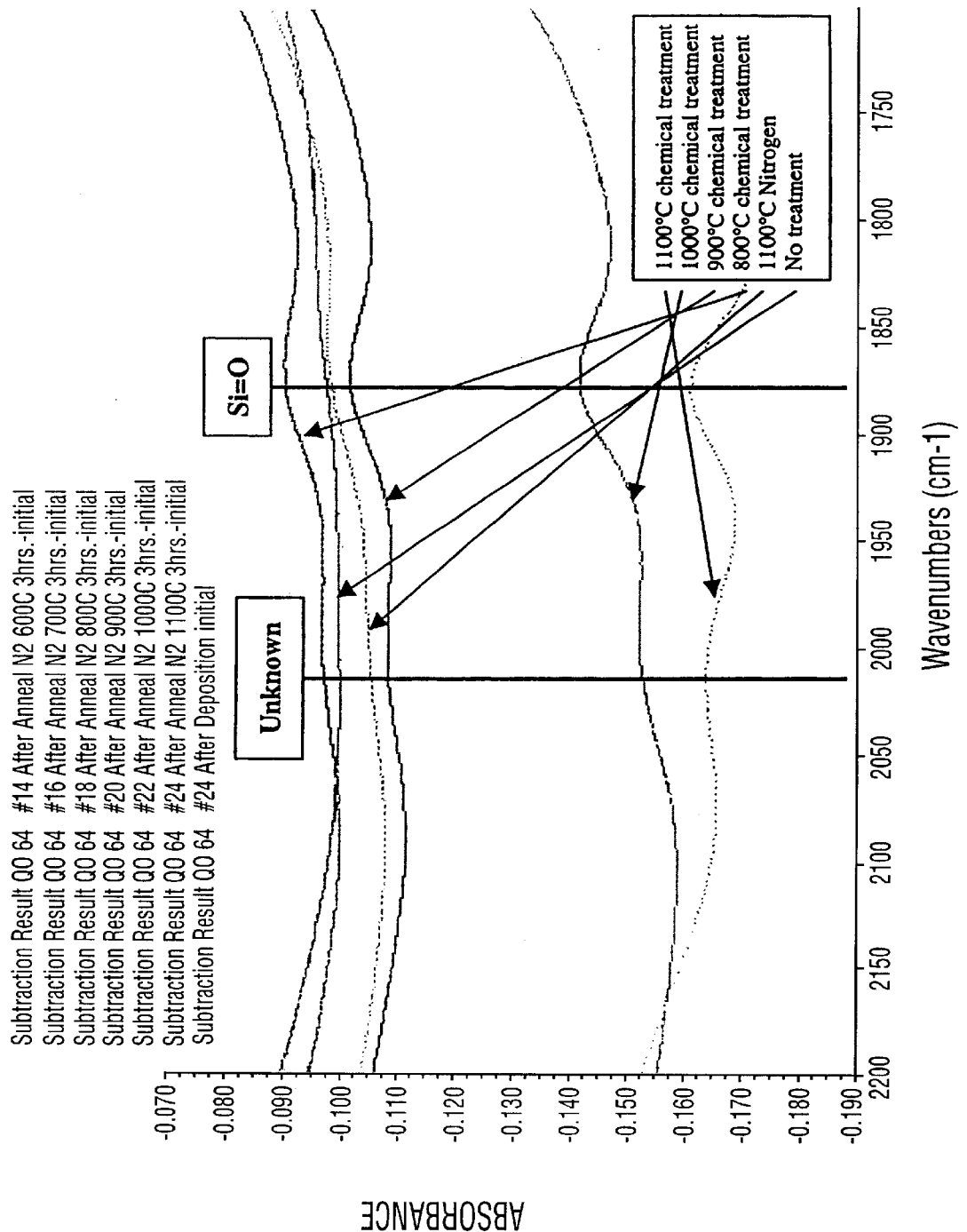
FIG. 14 is an expanded view of the FTIR spectra of FIG. 11 in the region between 1700 to 2200 $cm^{-1}$.

FIG. 14 shows a close-up of the FTIR spectra from 1700 to 2200 $cm^{-1}$. This region of interest focuses on the Si=O oscillators (centered at 1875 $cm^{-1}$) and on the unknown oscillator (centered at 2010 $cm^{-1}$) of the various compounds described by the various chemical reactions of FIG. 4. It is clear that the higher the temperature from 800 to 1100° C. in a $H_2$, $O_2$, and $H_2O$ ambient, the more evident the Si=O oscillators (which fourth harmonics could cause an optical absorption between 1.282 and 1.389 µm) and the unknown oscillators (which does not have a higher harmonics which could cause optical absorption in the 1.30 and 1.55 µm optical bands).

Figure 15:
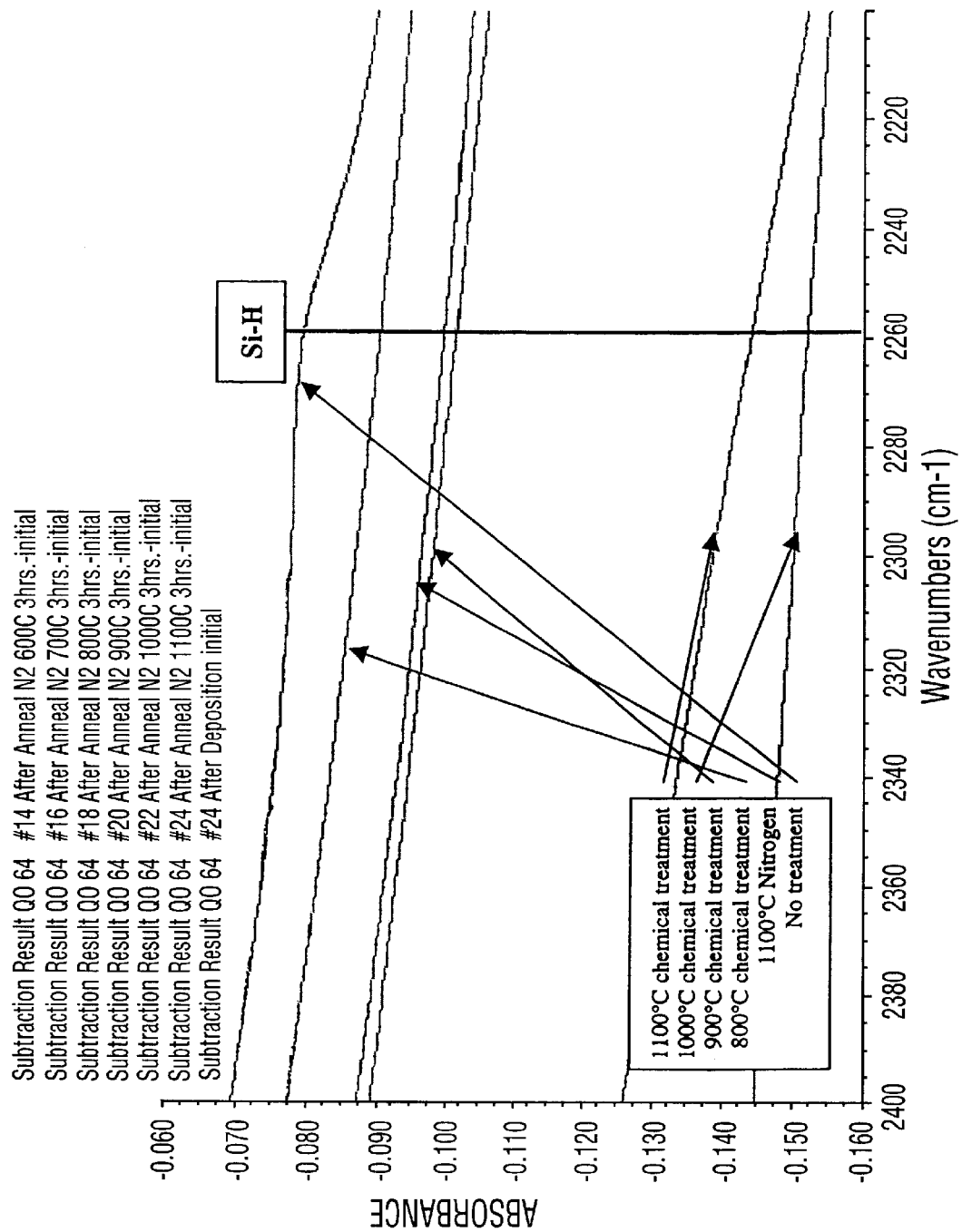
FIG. 15 is an expanded view of the FTIR spectra of FIG. 11 in the region between 2200 to 2400 $cm^{-1}$.

FIG. 15 shows a close-up of the FTIR spectra from 2200 to 2400 $cm^{-1}$. This region of interest focuses on the Si—H oscillators (centered at 2260 $cm^{-1}$) of the various compounds described by the various chemical reactions of FIG. 4. It is clear that these oscillators are completely eliminated by the high temperature chemical treatments and that a chemical treatment at a temperature of 800° C. is as efficient as the best thermal treatment at 1100° C. for the elimination of residual Si—H oscillators (which third harmonics could cause an optical absorption between 1.443 and 1.508 µm).

Figure 16:
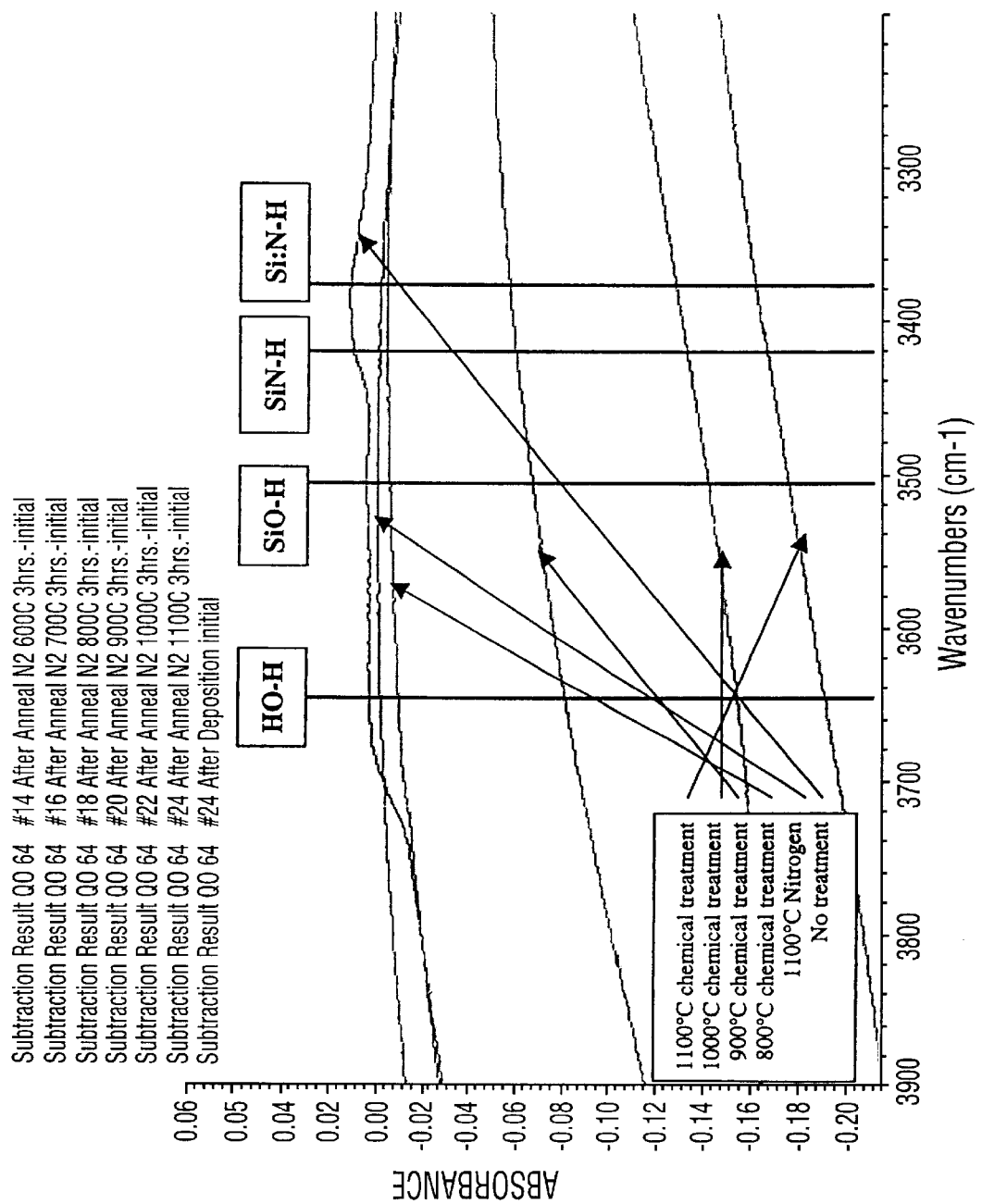
FIG. 16 is an expanded view of the FTIR spectra of FIG. 11 in the region between 3200 to 3900 $cm^{-1}$.

FIG. 16 shows a close-up of the 3200 to 3900 cm$^{-1}$ region of the FTIR spectra of FIG. 11. This region of interest focuses on the Si:N—H oscillators (centered at 3380 cm$^{-1}$), on the SiN—H oscillators (centered at 3420 cm$^{-1}$), on the SiO—H oscillators (centered at 3510 cm$^{-1}$) and on the HO—H oscillators (centered at 3650 cm$^{-1}$). It is clear that all these oscillators are completely eliminated by the high temperature chemical treatments and that a chemical treatment at a temperature of 800° C. is as efficient as the best thermal treatment at 1100° C. for the elimination of: the HO—H oscillators (trapped water vapour in the micro-pores of the silica films and which second harmonics could cause an optical absorption between 1.333 and 1.408 μm); the SiO—H oscillators (which second harmonics could cause an optical absorption between 1.408 and 1.441 μm); the SiN—H oscillators (which second harmonics could cause an optical absorption between 1.445 and 1.479 μm); the Si:N—H oscillators (which second harmonics could cause an optical absorption between 1.445 and 1.515 μm) are completely eliminated with a high temperature chemical treatment at a temperature as low as 800° C. This contrasts with their incomplete elimination using thermal decomposition in a thermal treatment at 1100° C. due to the difficulty of thermally breaking the two covalent bonds binding the nitrogen atom to the silicon atom of the $SiO_2$ network.

It should be obvious that the above described embodiments are merely illustrative of the application and of the principles of the present invention, and numerous modification thereof may be devised by those skilled in the art without departing from the spirit and scope of the invention.

What is claimed is:

1. A method of making a high quality optical silica film coated on a substrate with reduced optical absorbance, comprising:

(a) subjecting said substrate to a gaseous mixture of silane and nitrous oxide, to deposit said silica film on said substrate in accordance with the reaction $$SiH_4(g)+2N_2O(g) \rightarrow SiO_2+2N_2(g)+2H_2(g)$$

(b) subjecting the silica film coated on the substrate to a temperature of about 600° to about 1000° C. under nitrogen, under an inert atmosphere, or under vacuum;

(c) increasing the temperature to a maximum temperature of at most 1350° C.;

(d) exposing the silica film to a reactive atmosphere comprising oxygen atoms and hydrogen atoms for at least 30 minutes by replacing the nitrogen, inert atmosphere, or vacuum by the reactive atmosphere to chemically remove unwanted compounds;

(e) removing the silica film from the reactive atmosphere by replacing the reactive atmosphere with nitrogen, an inert atmosphere, or vacuum;

(f) decreasing the temperature from the maximum temperature to about 600° to about 1000° C.; and (g) recovering the silica film coated on the substrate.

2. The method according to claim 1, wherein the silica film is coated onto the substrate by a method selected from the group consisting of: flame hydrolysis, plasma enhanced chemical vapour deposition, low pressure chemical vapour deposition, metal organic vapour deposition, electron cyclotron resonance deposition, and RF Sputtering.

3. The method according to claim 2, wherein the silica film is coated on the substrate by plasma enhanced chemical vapour deposition.

4. The method according to claim 1, wherein the silica film is doped with an element selected from the group consisting of phosphorus, boron, germanium, and titanium.

5. The method according to claim 1, wherein the optical absorbance is reduced in the 1.30 and 1.55 μm optical bands.

6. The method according to claim 1, wherein the maximum temperature is 800° to 1200° C.

7. The method according to claim 1, wherein the method is carried out in a diffusion furnace.

8. The method according to claim 7, wherein the diffusion furnace is a horizontal furnace.

9. The method according to claim 1, wherein the substrate is a wafer having a diameter of 100 mm, 125 mm, 150 mm, 200 mm, or 300 mm.

10. The method according to claim 9, wherein the wafer has a diameter of 150 mm.

11. The method according to claim 1, wherein the substrate is silicon.

12. The method according to claim 1, wherein in step (b) the silica film coated on the substrate is placed in a diffusion oven at a temperature of about 700° C.

13. The method according to claim 1, wherein in step (b) the silica film coated on the substrate is loaded into a diffusion oven for about 5 to 120 minutes.

14. The method according to claim 1, wherein in step (b), the silica film coated on the substrate is loaded into a diffusion oven under nitrogen flow.

15. The method according to claim 1, wherein in step (b), the temperature is increased at a rate of about 2.5° to about 20° C./minute.

16. The method according to claim 1, wherein after step (c) and prior to step (d), the silica film is allowed to stabilise for about 10 to about 120 minutes.

17. The method according to claim 1, wherein the reactive atmosphere comprises flows of $O_2$ and $H_2$.

18. The method according to claim 1, wherein the reactive atmosphere comprises a flow of a gas selected from water vapour, hydrogen peroxide, and nitric acid.

19. The method according to claim 1, wherein in step (e), the reactive atmosphere is replaced with a nitrogen flow.

20. The method according to claim 1, wherein in step (e), the silica film is allowed to stabilise under the nitrogen atmosphere, inert atmosphere, or under a vacuum for a period of 10 to 120 minutes.

21. The method according to claim 1, wherein in step (f), the temperature is decreased at a rate of about 1° to about 10° C./minute.

22. The method according to claim 1, wherein in step (g), the silica film is recovered from a diffusion furnace after spending 5 to 120 minutes therein.

23. The method according to claim 1, wherein in step (g), the silica film is recovered under a nitrogen flow.

* * * * *